(12) United States Patent
Fujisawa et al.

(10) Patent No.: US 6,934,214 B2
(45) Date of Patent: Aug. 23, 2005

(54) SEMICONDUCTOR MEMORY DEVICE HAVING A HIERARCHICAL I/O STRUCTURE

(75) Inventors: Hiroki Fujisawa, Sagamihara (JP); Shuichi Kubouchi, Fussa (JP); Koichiro Ninomiya, Akishima (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 10/875,209

(22) Filed: Jun. 25, 2004

(65) Prior Publication Data

US 2004/0228176 A1 Nov. 18, 2004

Related U.S. Application Data

(60) Continuation of application No. 10/658,396, filed on Sep. 10, 2003, now Pat. No. 6,765,844, which is a division of application No. 09/866,623, filed on May 30, 2001, now Pat. No. 6,665,203.

(30) Foreign Application Priority Data

Jun. 29, 2000 (JP) ........................................ 2000-196024

(51) Int. Cl.[7] ................................................ G11C 8/00
(52) U.S. Cl. ...................... 365/230.03; 365/63; 365/207
(58) Field of Search ........................... 365/230.03, 207, 365/63, 230.06, 230.08

(56) References Cited

U.S. PATENT DOCUMENTS

| | | | |
|---|---|---|---|
| 5,644,527 A | 7/1997 | Kubota | |
| 5,793,664 A | 8/1998 | Nagata et al. | |
| 5,894,448 A | 4/1999 | Amano et al. | |
| 5,949,697 A | 9/1999 | Lee | |
| 6,072,743 A | 6/2000 | Amano et al. | |
| 6,097,660 A | 8/2000 | Tsuchida et al. | |
| 6,188,596 B1 * | 2/2001 | Holst | 365/63 |
| 6,333,869 B1 * | 12/2001 | Tanizaki et al. | 365/63 |

FOREIGN PATENT DOCUMENTS

| | | |
|---|---|---|
| JP | 2308489 | 12/1990 |
| JP | 02308489 | 12/1990 |
| JP | 9205182 | 8/1997 |
| JP | 10178158 | 6/1998 |

* cited by examiner

*Primary Examiner*—Anh Phung
(74) *Attorney, Agent, or Firm*—Antonelli, Terry, Stout & Kraus, LLP

(57) ABSTRACT

Memory array areas, each including a plurality of bit lines provided along a first direction, a plurality of word lines provided along a second direction orthogonal to the first direction, and a plurality of memory cells provided in association with portions where the plurality of bit lines and the plurality of word-lines intersect, respectively, are provided in plural form in the first direction and are disposed alternately relative to sense amplifier areas. First common input/output lines connected through bit lines and first selection circuits associated with such sense amplifier areas are provided. Second common input/output lines connected through the plurality of first common input/output lines and second selection circuits corresponding to a plurality of memory arrays disposed along the first direction are provided. Each of the second common input/output lines is extended to form a signal transfer channel for transferring a signal read from each memory cell and a signal written therein.

6 Claims, 15 Drawing Sheets

SEMICONDUCTOR MEMORY DEVICE HAVING A HIERARCHICAL I/O STRUCTURE

CROSS-REFERENCE TO RELATED APPLICATIONS

This application is a Continuation application of U.S. patent application Ser. No. 10/658,396 filed Sep. 10, 2003 now U.S. Pat. No. 6,765,844 issued on Dec. 16, 2003, which is a Divisional application of U.S. patent application Ser. No. 09/866,623 now U.S. Pat. No. 6,665,203, filed May 30, 2001, the entire disclosure of which is hereby incorporated by reference.

BACKGROUND OF THE INVENTION

The present invention relates to a semiconductor memory device; and, the invention relates to a technology that is effective for application to a device in which word lines and bit lines connected to dynamic memory cells are respectively divided into plural forms and which has hierarchical word lines and hierarchical IO lines.

As a result of investigations that were carried out subsequent to the completion of the present invention, Unexamined Patent Publication No. Hei 2(1990)-308489 (hereinafter called "prior art 1"), Unexamined Patent Publication No. Hei 9(1997)-205182 (corresponding to U.S. Pat. No. 5,793,664 and hereinafter called "prior art 2"), and Unexamined Patent Publication No. Hei 10(1998)-178158 (corresponding to U.S. Pat. No. 5,949,697 and hereinafter called "Prior art 3"), which are considered to be related to the technical subject matter of the present invention, were discovered. The prior art 1 discloses an arrangement wherein intermediate amplifiers (sub amplifiers) are provided outside each of a plurality of memory cell arrays. The prior art 2 discloses an arrangement wherein N channel type MOSFETs and P channel type MOSFETs of a sense amplifier control circuit are distributively disposed at a cross portion where a sense amplifier row and a sub-word driver column intersect. The prior art 3 discloses an arrangement wherein switch means for connecting GIO (Global Input/Output lines) and LIO (local Input/Output lines) brought into a hierarchical structure are distributively disposed in a conjunction area where a sense amplifier row (sense amplifiers) and a sub-word driver column intersect, and pairs of P channel type driver MOSFETs and N channel type driver MOSFETs of the sense amplifiers are disposed in the same conjunction area. However, none of these publications discloses or gives any consideration to a hierarchical IO structure according to the present invention, which is to be described later in this application.

SUMMARY OF THE INVENTION

The applicant of the present application has developed a dynamic RAM wherein word lines are divided by sub-word driver areas, bit lines are divided by sense amplifier areas, local input/output lines respectively connected to the bit lines are disposed in each of the sense amplifier areas, main input/output lines are disposed in each of the sub-word driver areas, and sub amplifiers for connecting the local input/output lines and main input/output lines and for performing signal amplification are distributively disposed in a cross area where the two intersect. In order to reduce the chip size of such a dynamic RAM (hereinafter called simply a "DRAM"), shrinkage in the sub-word driver area and sense amplifier area, which results in an increase in the number of repetitions, is unavoidable. As a result, the size of the cross area is drastically reduced in association with reductions in the sense amplifier width and sub-word driver width. It is therefore difficult to ensure an area for forming the sub amplifiers which perform the selective connections of the local input/output lines and the main input/output lines and the signal amplification.

Signals for selecting column switches for respectively connecting the main input/output lines, that are provided along the sub-word drivers and the bit lines to which each individual selected memory cells are connected, to the local input/output lines, that are provided along each sense amplifier, are set so as to extend in parallel with the main input/output lines. In a burst mode of the DRAM, the signals for selecting the column switches are sequentially switched to perform reading and writing of plural bits. However, since, at this time, the main input/output lines and the column-switch select signals are placed so as to be aligned in the same direction, the column-switch select signal would result in the generation of line-to-line noise in a signal read from or written into the corresponding memory cell connected to each of the bit lines respectively selected by the column-switch select signals, thus causing a problem in that operating margin is reduced.

An object of the present invention is to provide a semiconductor memory device having a hierarchical IO structure, which has achieved high integration and stabilization of its operation.

Another object of the present invention is to provide a semiconductor memory device having a hierarchical IO structure, which has achieved high integration and increased speed of operation.

The above, other objects and novel features of the present invention will become apparent from the description provided in the present specification and the accompanying drawings.

A summary of typical embodiment of the invention disclosed in the present application will be described in brief as follows. Memory array areas, each including a plurality of bit lines provided along a first direction, a plurality of word lines provided along a second direction orthogonal to the first direction, and a plurality of memory cells provided in association with portions where the plurality of bit lines and the plurality of word lines intersect, respectively, are provided in plural form in the first direction and are disposed alternately relative to sense amplifier areas. First common input/output lines are connected through bit lines, and first selection circuits associated with said sense amplifier areas are provided. Second common input/output lines are connected through the plurality of first common input/output lines, and second selection circuits corresponding to a plurality of memory arrays disposed along the first direction are provided. Each of the second common input/output lines is extended in the second direction to form a signal transfer channel for transferring a signal read from each memory cell and a signal written therein.

A summary of another typical of the invention disclosed in the present application will be described in brief as follows. Memory array areas, each including a plurality of bit lines provided along a first direction, a plurality of word lines provided along a second direction orthogonal to the first direction, and a plurality of memory cells provided in association with portions where the plurality of bit lines and the plurality of word lines intersect, respectively, are provided in plural form in the first direction and are disposed alternately relative to sense amplifier areas. First common input/output lines are connected through bit lines, and first selection circuits associated with said sense amplifier areas are provided. An amplifier circuit for transferring a signal between each of the plurality of first common input/output lines and at least one second common input/output line, both associated with a plurality of memory arrays disposed along the first direction according to a select signal, is used to configure each of a plurality of second selection circuits. Such an amplifier circuit comprises a sub amplifier for reading, comprising differential type first and second MOSFETs having gates to which the first common input/output lines are connected, and having drains cross-connected to the second common input/output line, third and fourth MOSFETs which are respectively provided at the sources of the first and second MOSFETs and each of which forms an operating current according to a select signal, and a fifth MOSFET which is provided between the sources of the differential MOSFETs and is turned off upon at least a write operation, and a CMOS buffer for writing, comprised of a pair of devices consisting of a P channel type MOSFET and a N channel type MOSFET for driving the first common input/output lines in response to complementary signals from the second common input/output lines.

DETAILED DESCRIPTION OF THE INVENTION

Figure 1:
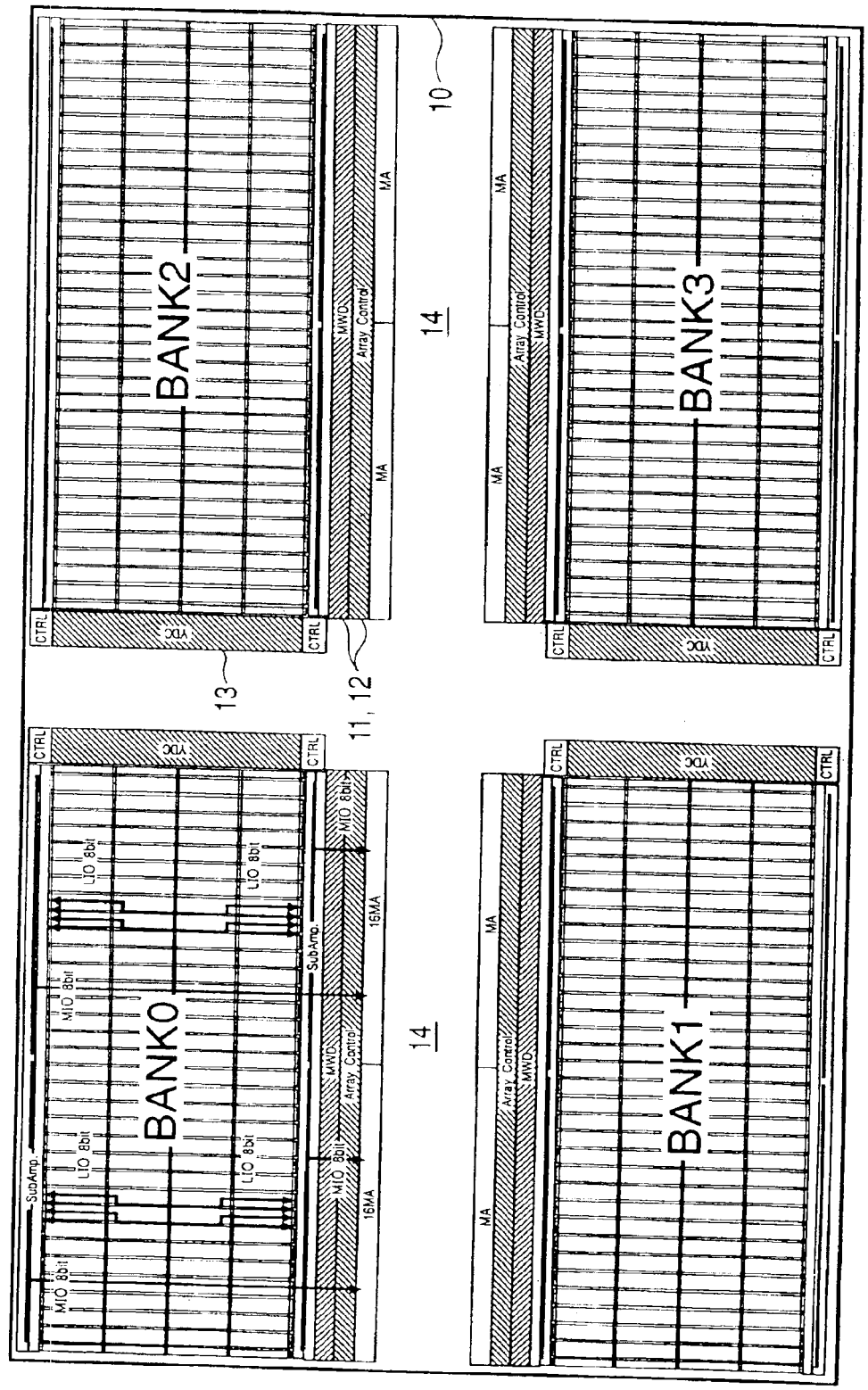
FIG. 1 is a schematic diagram showing the overall layout of one embodiment of a DRAM according to the present invention.
Figure 2:
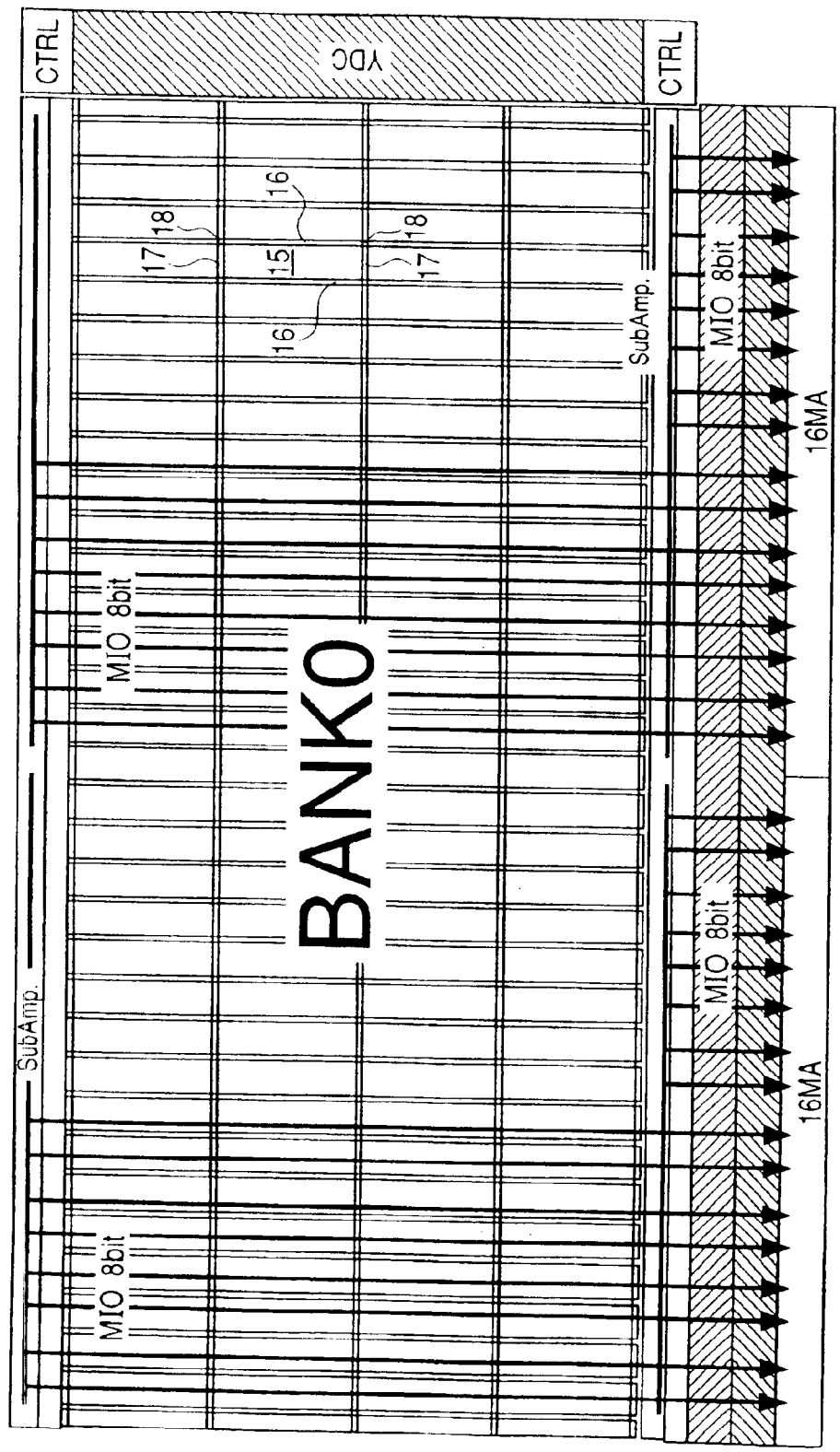
FIG. 2 is an enlarged diagram of a part of FIG. 1.

FIG. 1 is a schematic diagram of one embodiment of a DRAM according to the present invention, and FIG. 2 is a partly enlarged diagram of a portion thereof, respectively. In FIGS. 1 and 2, principal parts of respective circuit blocks, which constitute the dynamic RAM according to the present invention, are shown so as to be understood therefrom. They are formed on a single semiconductor substrate like monocrystal silicon by known semiconductor integrated circuit manufacturing technology.

Although the invention is not restricted in particular, the DRAM to which the present invention is applied is provided with four memory banks BANK0 though BANK3, respectively, that are independently memory-accessed. These four memory banks BANK0 through BANK3 are identical to one another in circuit configuration and layout. A portion related to a hierarchical IO structure according to the present invention is illustratively shown in the memory bank BANK0 as a typical example.

In FIG. 1, memory cell array areas (hereinafter called simply "memory cell arrays") are divided into four as a whole. Namely, the memory cell array areas are parted from side to side as viewed in the longitudinal direction of a semiconductor chip 10. Although not illustrated, in each of the central portions 14, there are provided an address input circuit, a data input/output circuit, an input/output interface circuit, power circuits, such as a booster circuit and a debooster circuit, etc. Main amplifiers MA, memory array controls (Array controls) 11, main word drivers (MWD) 12, etc. are disposed at portions where both sides of these central portions 14 and the memory cell arrays respectively adjoin one another. The array control 11 comprises a control circuit for driving a sub-word select line and a sense amplifier. In the memory cell arrays, which are comprised of four arrays divided into two on both sides and two up and down with respect to the longitudinal direction of the semiconductor chip 10, as described above, column decoder areas (YDC) 13 are provided in upper and lower central portions with respect to the longitudinal direction of the semiconductor chip 10.

In each memory cell array as described above, the main word driver 12 produces or forms a signal for selecting each of the main word lines extended so as to pass or extend through one memory array area (hereinafter called simply a "memory array") corresponding to the main word driver 12. A driver for selecting a sub-word select line is provided in each main word driver area 12. As will be described later, the driver extends in parallel to the main word line and produces a signal for selecting each sub-word select line. Each of a plurality of column decoders 13 forms a signal for selecting one of a plurality of column select lines which extends so as to penetrate one memory cell array corresponding thereto.

The respective memory cell arrays are divided into a plurality of memory arrays (hereinafter called simply "arrays or memory mats") 15. The memory mat 15 is formed so as to be surrounded by sense amplifier areas 16 and sub-word driver areas 17 as illustrated in its enlarged view. Portions where the sense amplifier areas 16 and the sub-word driver areas 17 intersect, respectively, are called intersecting areas (cross areas) 18. Sense amplifiers provided in the sense amplifier areas 16 comprise latch circuits each having a CMOS configuration. Although the invention is not restricted in particular, the memory cell array employed in the present embodiment is defined as a so-called one-intersection type or system or open bit line type that amplifies signals on complementary bit lines extended from side to side with a sense amplifier as the center.

Although the invention is not restricted in particular, one memory mat 15 has 512 sub-word lines (word lines) and ones (or data lines) corresponding to 1024, of complementary bit lines orthogonal to the sub-word lines. In one memory cell array (BANK0 through BANK3), 32 memory mats 15 are provided as normal ones as viewed in the extending direction of each bit line, and edge (dummy) mats are provided there by three, at which edge mats dummy bit lines each used to form a reference voltage are provided. Since the number of memory cells in each normal memory mat becomes half, the edge mats may be used for redundancy.

Of the three edge mats, two correspond to edge mats and are provided on both ends, as viewed in the bit-line direction, of the memory cell array in the drawing, and the remaining one edge mat is provided in the central portion of the memory cell array, even though it is called an "edge mat". In the present embodiment, one memory cell array (memory bank) is divided into two for the purpose of accommodating a DDR (Double Data Rate Synchronous Dynamic Random Access Memory: hereinafter called simply "DDR SDRAM) which reads out data corresponding to two words in one selecting operation, outputs the same to its corresponding output unit in parallel and serially inputs and outputs the data one word by one word on both the rising and falling edges of a clock signal. In the case of a write operation, data corresponding to two words are serially inputted thereto in reverse, and they are simultaneously written into the corresponding memory cell in parallel.

In order to meet the requirements of such a DDR SDRAM, the memory cell array corresponding to one memory bank is divided into two memory blocks as viewed in the bit-line direction, and a memory cell corresponding to each word is selected from each of the memory blocks. Therefore, half or fifty-fifty of the bit lines in the memory array placed in the central portion of the memory cell array are used as edge mats of the divided two memory blocks.

Since the memory mat 15 is provided so that pairs of complementary bit lines are divided from side to side with each sense amplifier 16 as the center in the one-intersection system, the bit lines are substantially divided into groups of sixteen by the memory mats 15 as viewed in the bit-line extending direction. Four memory mats 15 are provided in the direction in which the word lines extend. Thus, the sub-word lines are divided into four by the memory mats 15 as viewed in the word-line extending direction.

Since 1024 bit lines are provided in one memory mat 15, except for the above-described edge memory mats, about 4K memory cells are connected in the word-line direction. Since 512 sub-word lines are provided, 512×32=16K memory cells are connected in the bit-line direction. Thus, one memory cell array (memory bank) has a storage capacity of 4K×16K=64 Mbits. The four memory arrays (memory banks) have a storage capacity of 4×64M=256 Mbits over the whole memory chip.

In FIG. 2, sub amplifiers (Sub Amp) are provided on both sides as viewed in the word-line direction of the memory cell array. In association with the sub amplifiers, main input/output lines MIO extend in parallel outside of the sub amplifiers and the memory cell array. In this case, the main input/output lines MIO corresponding to the two memory arrays corresponding to the right half of the two-divided arrays, of the four memory arrays (memory mats), are disposed by eight bits on the right side of the memory cell array, i.e., in the direction of the center of the semiconductor chip. The main input/output lines MIO corresponding to the two memory arrays of the left half are disposed by eight bits on the left side of the memory cell array, i.e., near the end of the semiconductor chip as viewed in the longitudinal direction thereof.

Since the respective memory blocks perform the input/output of data in 18-bit units, eight by eight bits in one memory cell array, as described above, a total of thirty-two main amplifiers MA are provided, sixteen by sixteen in association with them. It should be understood that the main amplifiers MA include even write amplifiers for writing, as well as amplifiers each corresponding to a read operation. Thus, data is outputted twice in parts 16-bits by 16-bits or captured in parts twice by 16 bits in synchronism with the rising and falling edges of one clock upon 32-bit reading by one memory access on a 16 bits-by-16 bits basis, whereby the data can be written into the corresponding memory cell in 32-bit units.

Figure 3:
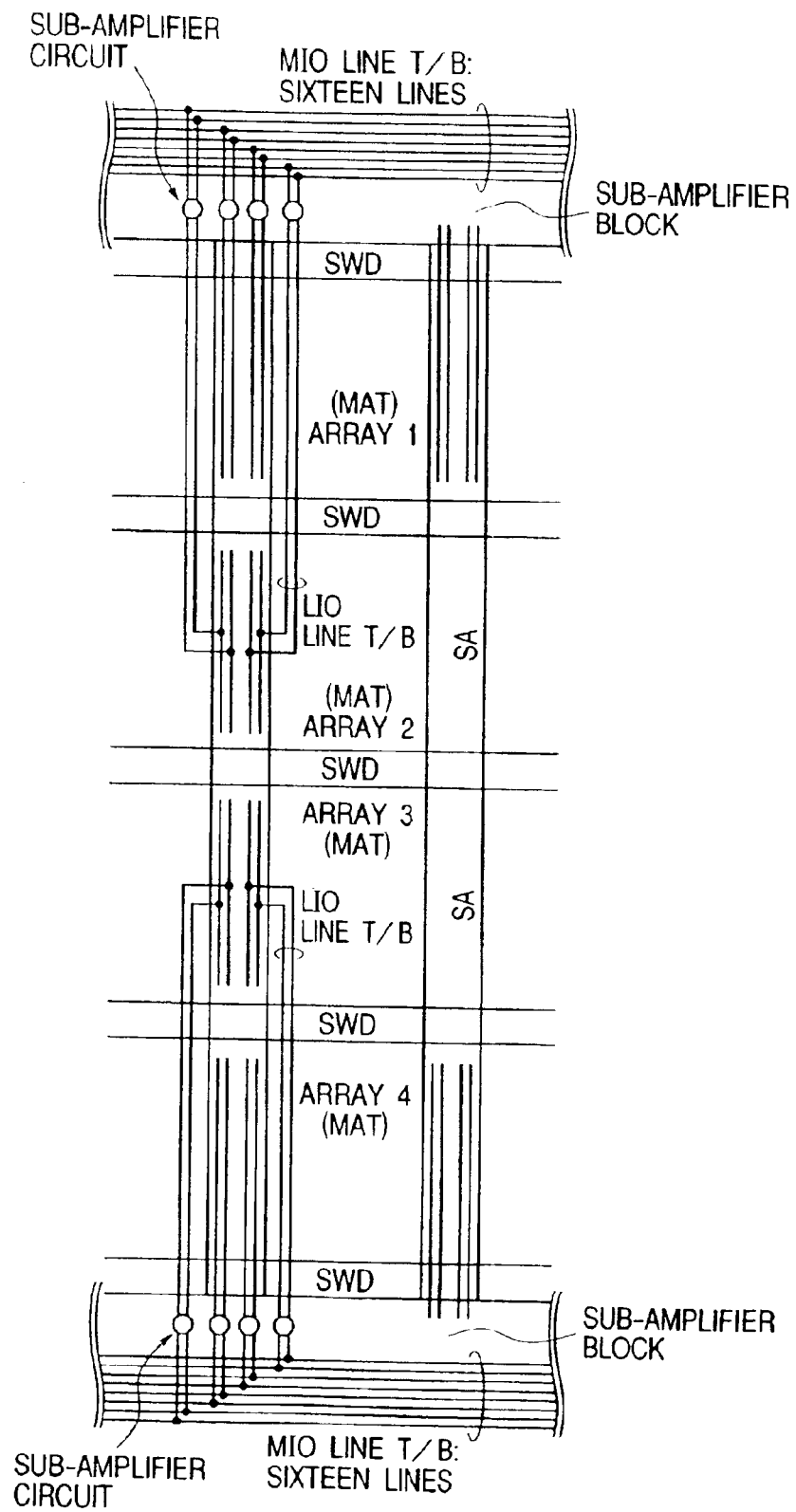
FIG. 3 is a schematic diagram illustrating the relationship between main input/output lines MIO and local input/output lines LIO provided in a memory array unit, both of which are shown in FIG. 2.

A layout diagram of one embodiment showing the relationship between the main input/output lines MIO and local input/output lines LIO provided at a memory array unit is shown in FIG. 3. For Memory arrays are provided as viewed in the word-line extending direction, such as arrays (mats) 1 through 4. The respective arrays 1 through 4 provided in the word-line direction are provided with sub-word line SWD. Word lines to which memory cells are connected are divided into four by these lines SWD. Bit lines are divided into sixteen by their corresponding sense amplifiers SA when regarded as complementary bit lines as described above. Local input/output lines LIO extend over the sense amplifiers SA along the bit-line direction. Although omitted in the drawing, the local input/output lines LIO provided on the sense amplifiers SA are selectively connected to their corresponding bit lines of each memory array through a column switch MOSFET used as a first selection circuit.

The local input/output lines LIO associated with the array 1 comprise two pairs of lines for transferring complementary signals, each of which is comprised of a true T (non-inversion) and a bar B (inversion). One of the true T and the bar B is connected to its corresponding bit line provided in one memory mat with a sense amplifier as the center, and the other thereof is connected to its corresponding bit line provided in the other memory mat with a sense amplifier as the center. In this case, a signal read into its corresponding bit line of each memory mat on the selected side of a word line is amplified by its corresponding sense amplifier with a precharge voltage on a bit line of each memory mat on the non-selected side of a word line as a reference voltage.

The two pairs of local input/output lines corresponding to the sense amplifier SA of the array 1 extend toward the outside of the chip as they are, in other words, they extend toward two sub-amplifier circuits. Local input/output lines LIO corresponding to the array 2 are also provided as two pairs in the same manner as described above. However, they extend over the arrays 2 and 1 and extend toward the outside of the semiconductor chip through the use of signal lines so as to be connected to the two sub-amplifier circuits. Thus, the input/output of data corresponding to 4 bits to and from one sense amplifier sequence or array is carried out in the arrays 1 and 2.

When the corresponding word line of the array 1 is selected, bit lines are divided fifty-fifty among 1024 bits lines intersecting the word line and connected to their corresponding sense amplifiers. Therefore, when the word line of the array 1 is selected, other sense amplifiers SA provided so as to interpose the array 1 therebetween are also provided with local input/output lines LIO at which the input/output of data corresponding to two bits is performed in the same manner as described above. This is similar even to local input/output lines LIO provided in other sense amplifiers SA corresponding to the array 2. Accordingly, the reading and writing of data corresponding to eight bits as a whole are allowed in the arrays 1 and 2.

The two pairs of local input/output lines corresponding to each sense amplifier SA of the array 4 extend inwardly of the chip as they are, in the opposite direction as each of the arrays 1 and 2, in other words, they extend to two sub-amplifier circuits provided adjacent to a main word driver. Local input/output lines LIO corresponding to the array 3 are also provided as two pairs in the same manner as described above. However, they extend over the arrays 3 and 4 and extend toward the inside of the semiconductor chip through the use of signal lines so as to be connected to the two sub-amplifier circuits. Thus, the input/output of data corresponding to 4 bits to and from one sense amplifier sequence or array is carried out in the arrays 3 and 4.

When the corresponding word lines of the arrays 3 and 4 are selected in the same manner as described above, other sense amplifiers SA provided so as to interpose the arrays 3 and 4 therebetween are also provided with local input/output lines LIO at which the input/output of data corresponding to two bits is performed in the same manner as described above. Accordingly, the reading and writing of data corresponding to eight bits as a whole are allowed even in the arrays 3 and 4. As a result, one memory block enables 16 bits to be read and written. Thus, sixteen main amplifiers MA (including even write amplifiers) are provided in the one memory block.

In the embodiment illustrated in FIG. 2, the main input/output lines MIO corresponding to the eight bits, which are provided along the outer periphery of the semiconductor chip, as viewed in the longitudinal direction thereof, of the main input/output lines MIO provided outside the memory cell array, as viewed in the word-line direction of the memory cell array, extend so as to cross the memory array (four memory arrays or memory mats arranged in the word-line direction). Further, they cross across the main word driver MWD and array control so as to reach the main amplifiers MA. On the other hand, the main input/output lines MIO corresponding to the remaining eight bits, which are provided inside the semiconductor chip, as viewed in the longitudinal direction thereof, of the main input/output lines MIO provided outside the memory cell array, as viewed in the word-line direction of the memory cell array, cross across the main word driver MWD and array control so as to reach the main amplifiers MA.

In the embodiment shown in FIG. 2, wirings extended so as to cross the four memory arrays or memory mats arranged in the word-line direction of the memory cell array, which are connected to the main input/output lines MIO corresponding to the eight bits provided along the outer periphery of the semiconductor chip, as viewed in the longitudinal direction thereof, are provided as follows. Eight pairs of signal lines for transferring signals corresponding to eight bits equivalent to half of the sixteen memory mats obtained by dividing one memory block in the bit-line direction are provided so as to be dispersed over the eight memory mats. The eight memory mats may be provided for eight memory mats adjacent to one another or allocated to alternate memory mats.

Figure 4:
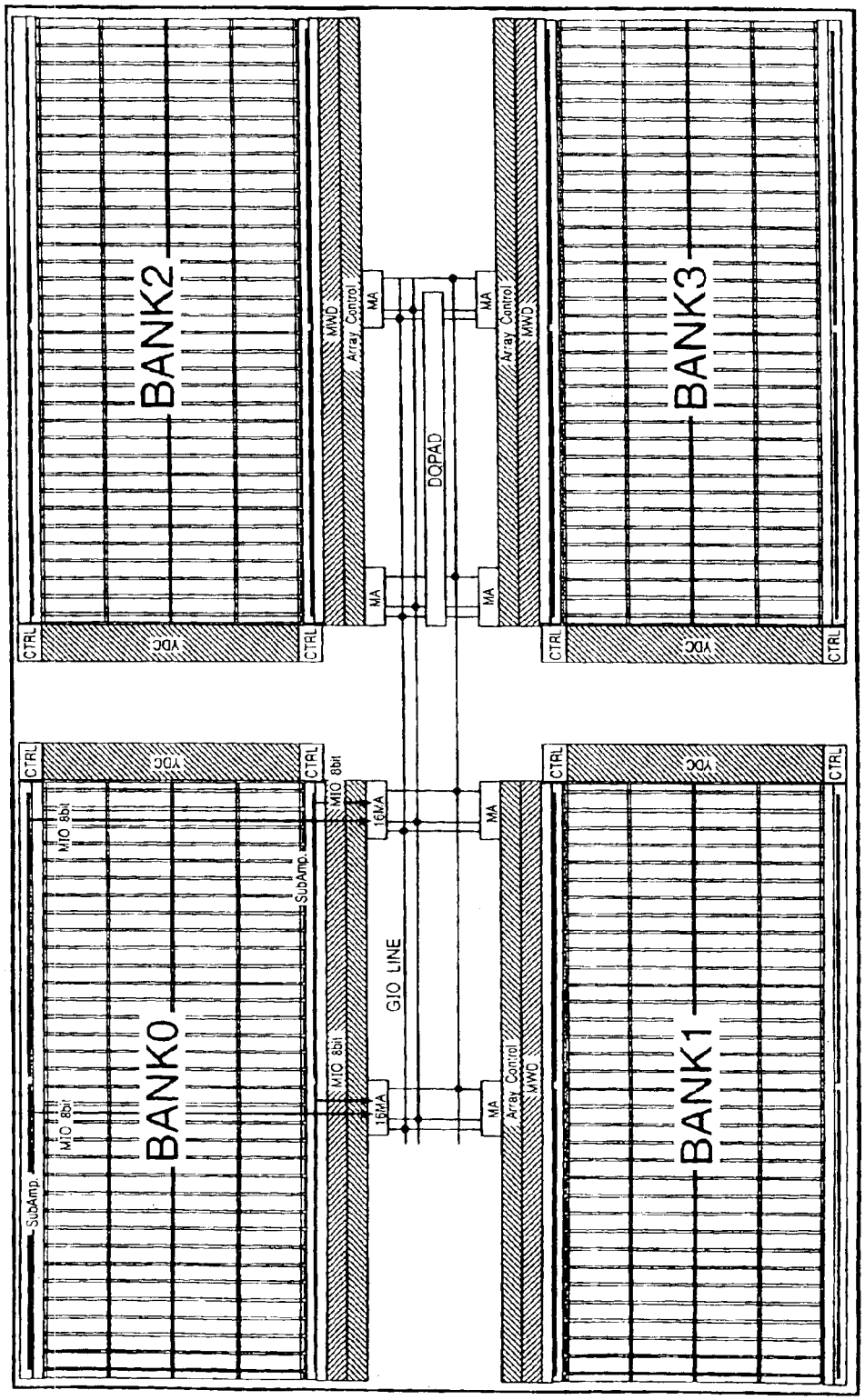
FIG. 4 is a schematic diagram showing the overall layout of another embodiment of a DRAM according to the present invention.

A schematic diagram of the overall layout of another embodiment of a DRAM according to the present invention is shown in FIG. 4. In the present embodiment, wirings disposed so as to cross across and extend over four memory arrays (memory mats) arranged in a word-line direction of each memory cell array, which are connected to main input/output lines MIO corresponding to eight bits provided along the outer periphery of a semiconductor chip, as viewed in its longitudinal direction, of main input/output lines MIO provided outside the memory cell array, as viewed in the word-line direction of each memory cell array, are different from those disposed so as to spread over each memory mat as in the embodiment shown in FIG. 2. In each of two memory blocks in each memory cell array, signal lines corresponding to the eight bits are concentratedly placed on one memory mat nearest the central vicinity of the semiconductor chip.

Namely, a description will be given of a memory bank BANK0, as an example. The wirings are laid out so as to cross, in a word-line direction, memory arrays provided at the innermost portion of the semiconductor chip, i.e., in the vicinity of substantially the center of the memory bank BANK0 as viewed in the bit-line direction, of sixteen normal memory arrays arranged in the bit-line direction, which constitute the memory block located outside the semiconductor chip, of the two memory blocks as described above. Main amplifiers (including even write amplifiers) corresponding to eight bits are disposed on a centralized basis in association with such a centralized layout of signal lines.

Similarly, wirings connected to main input/output lines MIO corresponding to the remaining eight bits provided inside each memory cell array, as viewed in the word-line direction of the memory cell array, are also concentratedly provided. Main amplifiers MA corresponding to the remaining eight bits are provided in association with them. Accordingly, sixteen main amplifiers corresponding to the memory blocks located outside the semiconductor chip, of the two memory blocks of the memory bank BANK0, as described above, are intensively provided substantially at the boundary of the two memory blocks.

In the other memory block of the memory bank BANK0, i.e., the memory block located inside the semiconductor chip, main input/output lines MIO corresponding to eight bits provided outside the memory cell array, as viewed in the word-line direction of the memory cell array, are guided to main amplifiers MA corresponding to eight bits by wirings so that memory arrays provided at the innermost portion of the semiconductor chip, of sixteen normal arrays arranged in the memory bit-line direction, i.e., at the edge lying in the direction of the center of the memory bank BANK0, as viewed in the bit-line direction. Similarly, wirings connected to main input/output lines MIO corresponding to the remaining eight bits, which are provided inside the memory cell array, as viewed in the word-line direction of the memory cell array, are provided on a centralized basis, so as to be adjacent thereto, and are connected to their corresponding main amplifiers MA corresponding to the remaining eight bits.

The above configurations are similar to the other memory banks BANK1 through BANK3. The sixteen main amplifiers MA of such four memory banks BANK0 through BANK3 are commonly connected to one another through global input/output lines GIO, and they are connected to a data input/output circuit associated with 16-bit data input/output terminals DQPAD. The centralized layout of the main amplifiers MA in the respective memory banks (memory cell arrays) BANK0 through BANK3 makes it possible to shorten the length of each global input/output line GIO to about half of the semiconductor chip, as viewed in the longitudinal direction thereof.

Namely, when the main amplifiers MA are distributedly laid out in association with the respective memory mats in the respective memory banks BANK0 through BANK3 as in the embodiment shown in FIG. 1, the length of each of the global input/output lines GIO results in substantially the longitudinally-extending length of the semiconductor chip with a view toward commonly connecting all the corresponding main amplifiers MA provided in the respective memory banks BANK0 through BANKS 3 by the global input/output lines GIO. Thus, the transfer of each signal through the global input/output lines GIO becomes slow as compared with the embodiment shown in FIG. 4. In other words, in the embodiment illustrated in FIG. 4, contrivances for the layout of the main amplifiers MA and/or the wirings for connecting the main amplifiers MA and the main input/output lines MIO are carried out, to thereby shorten the time required to transfer the signal through the global input/output lines GIO and allow for a speeding up of the operation.

Figure 5:
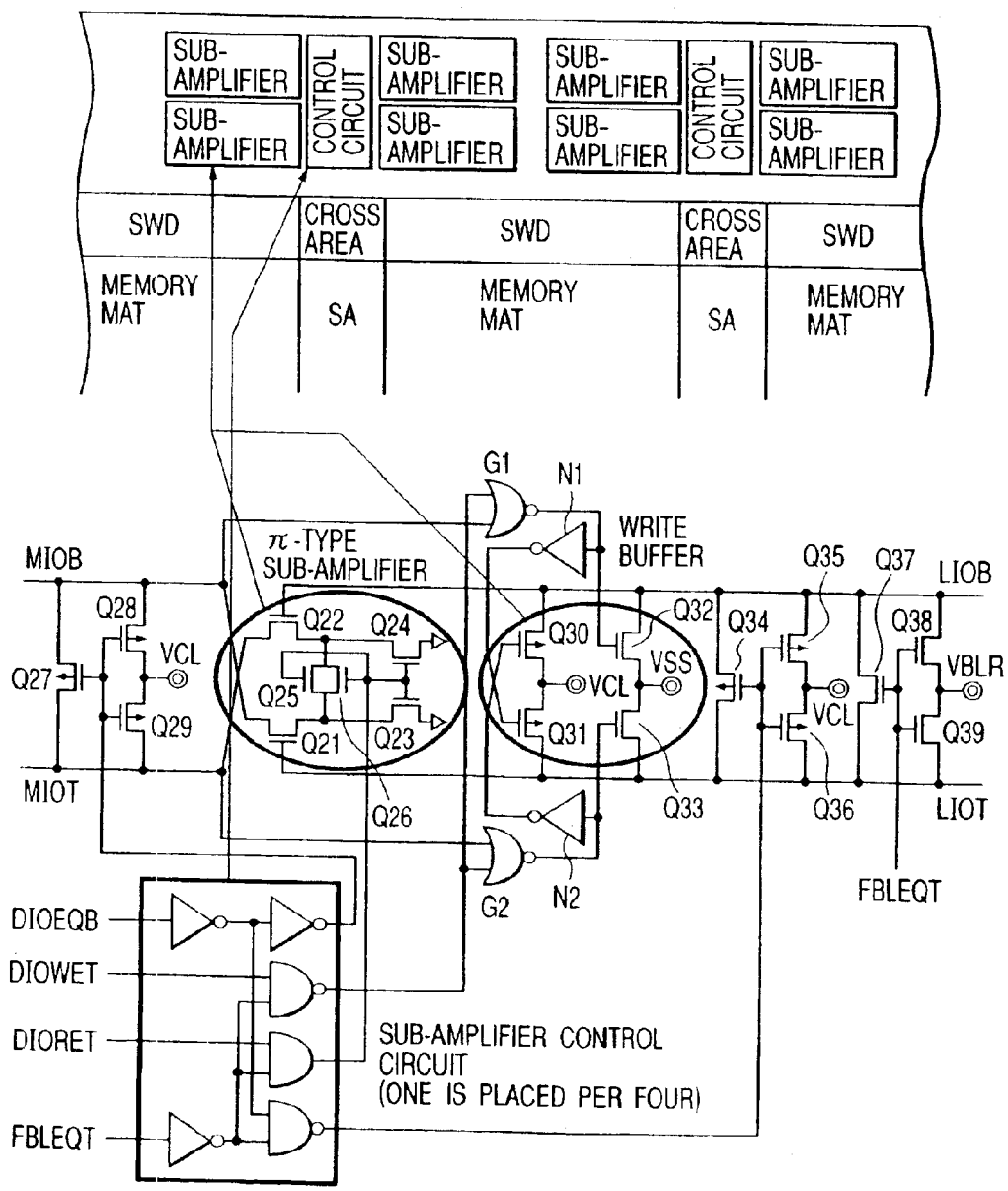
FIG. 5 is a schematic diagram showing one embodiment of a sub amplifier according to the present invention.

A schematic diagram of one embodiment of a sub amplifier according to the present invention is shown in FIG. 5. The layout of sub amplifiers and their control circuits corresponding to the embodiment shown in FIG. 3, and their circuits are specifically illustrated in the drawing. As described above, the two pairs of local input/output lines LIO are disposed on the sense amplifier area SA corresponding to one memory array. Four sub amplifiers corresponding to four pairs of local input/output lines LIO in total as viewed from two memory arrays provided along a sense amplifier array or sequence (in a word-line direction) are provided outside a memory cell array so as to adjoin sub-word driver areas SWD. Although the invention not restricted in particular, the four sub amplifiers are disposed so as to be divided into two-by-two sub amplifiers with a control circuit provided in a central portion being interposed therebetween.

The sub amplifier comprises a read-system amplifier circuit and a write-system amplifier circuit and has the switch function of connecting between the local input/output lines LIO and main input/output lines MIO together. Namely, the transmission of a signal is carried out owing to the setting of either the read-system amplifier circuit or the write-system amplifier circuit to an operating state, thereby selectively connecting the local input/output lines LIO and the main input/output lines MIO.

It is also considered that a switch MOSFET can be used to connect the local input/output lines LIO and the main input/output lines MIO, and a sub amplifier comprised of a latch circuit can be provided and used for both read/write operations. In this case, however, it is difficult to set the timing provided to operate the latch circuit and speed up the operation. Namely, the amplifying operation using the latch circuit needs to wait for the operating timing until the latch circuit obtains a signal amount required to stably operate. Further, the setting of a timing margin, at the time that the worst case is supposed to occur, is needed, and hence, the operating speed becomes slow.

On the other hand, since the signal is always transmitted only to one of the read-system amplifier circuit and the write-system amplifier circuit in the case of the configuration in which they are separately provided, as in the present embodiment, no limitation is imposed on the setting of the timing. In the case of a read operation, the signal that has appeared on the local input/output lines LIO is transmitted to the main input/output lines MIO as it is; whereas, in the case of a write operation, the signal transmitted to the main input/output lines MIO is transferred to the local input/output lines LIO as it is. It is therefore possible to perform quick or high-speed reading and writing.

The read-system amplifier circuit is provided with an N channel type MOSFET Q21 whose gate is connected to a local input/output line LIOT on the true side, an N channel type MOSFET Q22 whose gate is connected to a local input/output line LIOB on the bar side, N channel type MOSFETs Q23 and Q24 provided between the sources of the amplifying MOSFETs Q21 and Q23 and a circuit's ground potential, to thereby cause an operating current to flow in response to a select signal, and switch MOSFETs Q25 and Q26 provided in parallel between the sources of the amplifying MOSFETs Q21 and Q22 for a read operation. These MOSFETs Q25 and Q26 are turned on for a read operation to connect between the sources of the amplifying MOSFETs Q21 and Q22, thereby causing a differential operation. Further, the MOSFETs Q25 and Q26 prevent the connection between main input/output lines MIOT and MIOB even when, for a write operation, they are turned off and the amplifying MOSFETs Q21 and Q22 are turned on in response to a write signal.

The switch MOSFETs Q25 and Q26 can be comprised basically of one MOSFET. However, as in the present embodiment, the two MOSFETs Q25 and Q26 are connected in parallel, thereby to reduce the values of resistors connected to the sources of the differential MOSFETs Q21 and Q22, to speed up their amplifying operation, to bring circuits into bilateral symmetry so that an element layout is also set as a mirror reversed configuration, and to enhance the efficiency of the layout together with even pair characteristics of the differential MOSFETS.

The drain of the differential MOSFET Q21, which receives a signal on the local input/output line LIOT on the true side, is connected to its corresponding main input/output line MIOB on the bar side. The drain of the differential MOSFET Q22, which receives a signal on the local input/output line LIOB on the bar side, is connected to its corresponding main input/output line MIOT on the true side. Thus, the signals on the local input/output lines LIO and the signals on the main input/output lines MIO, to which the signals on the local input/output lines LIO are transferred, are identical in phase to one another.

The write-system amplifier circuit comprises a CMOS buffer circuit. Namely, a three-state output circuit of CMOS, which is brought into an output high impedance state, except for a latch operation, is used. The local input/output line LIOT on the true side is driven by an N channel type MOSFET Q33 and a P channel type MOSFET Q31. The local input/output line LIOB on the bar side is driven by an N channel type MOSFET Q32 and a P channel type MOSFET Q30.

The gate of the N channel type MOSFET Q33 for driving the local input/output line LIO on the true side is supplied with a signal on the main input/output line MIOT on the true side through a NOR gate circuit G2. The gate of the P channel type MOSFET Q31 for driving the local input/output line LIOB on the true side is supplied with a signal on the main input/output line MIOB on the bar side through a NOR gate circuit G1 and an inverter circuit N1. The gate of the N channel type MOSFET Q32 for driving the local input/output line LIOB on the bar side is supplied with the signal on the main input/output line MIOB on the bar side through the NOR gate circuit G1. The gate of the P channel type MOSFET Q30 for driving the local input/output line LIOB on the bar side is supplied with the signal on the main input/output line MIOT on the true side through the NOR gate circuit G2 and an inverter circuit N2.

The NOR gate circuits G1 and G2 form and output low level signals regardless of the signals on the main input/output lines MIOT and MIOB in response to a control signal produced by a sub-amplifier control circuit, except for a write operation. Thus, the driving N channel type MOSFETs Q32 and Q33 and P channel type MOSFETs Q30 and Q31 are turned off so that they are respectively brought into an output high impedance state. Since the signals outputted from the NOR gate circuits G1 and G2 are provided so as to transmit signals corresponding to the main input/output lines MIOT and MIOB for a write operation, the local input/output lines LIOT and LIOB are driven correspondingly so that the signals become in phase with each other.

N channel type MOSFETs Q37 through Q39 for precharging the local input/output lines LIOT and LIOB to an intermediate voltage VBLR and P channel type MOSFETs Q34 through Q37 for precharging them to an internal source voltage VCL are provided for the local input/output lines LIOT and LIOB. These precharge circuits are used so as to switch the local input/output lines LIO to the VBLR and VCL according to the read/write operations.

In the above-described DRAM according to the present invention, the sub-amplifiers are collectively disposed in parallel with the sub-word drivers SWD outside the memory cell array without being laid out in each cross area. The local input/output lines LIO far from the sub amplifiers are connected to their corresponding sub amplifiers so as to pass over the array from above each sense amplifier SA. The main input/output lines MIO are connected to their corresponding main amplifiers MA so as to pass over the sub-amplifier areas. The main amplifier MA circuits are placed side by side in the direction orthogonal to each Y decoder area.

In the present embodiment, the sub amplifiers are placed outside the memory cell array in parallel with the sequence or array of lines SWD without being laid out in the cross area. In this configuration, the local input/output lines LIO in the array 1 are connected so as to pass over the sense amplifier. The local input/output lines in the array 2 pass over their corresponding sense amplifier and thereafter are connected to the corresponding sub amplifier so as to pass over the array. Thus, a hierarchical IO structure can be realized even if the sub amplifiers are not laid out in the cross area.

Laying out no sub amplifiers in each cross area yields respective benefits, such as a reduction in the number of wirings on each sub-word driver area SWD, a reduction in the number of circuits in each cross area and a constraint reduction in the area of each sub-amplifier circuit. Incidentally, since the sub amplifiers are provided outside the memory cell array, the length of each local input/output line LIO becomes long correspondingly. However, the sense amplifiers connected to their corresponding local input/output lines LIO are identical in number, and the parasitic capacitances of the local input/output lines LIO fall under the control of source and drain diffused layers of MOSFETs constituting such sense amplifiers. Accordingly, a reduction in the signal transmission rate due to an increase in wiring length by the provision of such wirings as described in the embodiment is next to nothing.

In the present embodiment, the main amplifiers MA are disposed on the main word driver MWD side without being placed on the Y decoder YDC side, and the main input/output lines MIO are connected so as to pass over the memory cell array. In the present configuration, the number of the MIO lines that pass over the sub-amplifier blocks can be reduced in half. When the main amplifiers MA are placed on the Y decoder YDC side, the thirty-two main input/output lines MIO must be passed over the sub-amplifier blocks where one memory cell array (memory bank) referred to above is divided into two memory blocks. Thus, the main input/output lines MIO can be reduced to half corresponding to sixteen on the sub-amplifier blocks as shown in FIGS. 2 and 3. Since the wirings, which cross over the memory cell array, can easily be implemented by causing the wirings to pass between main word lines MWL, no problem occurs.

When the main amplifiers MA are centrally located as in the embodiment shown in FIG. 4, no limitations are imposed on over which array the main input/output lines MIO should be passed. Thus, each of the main amplifiers MA is placed in the center of the chip so that the length of each output (GIO line) signal line for the main amplifier MA becomes shortest, and wirings for allowing the crossing of the main input/output lines MIO are passed over the memory cell array corresponding to its position. It is thus possible to reduce the wiring lengths of the global input/output lines GIO which extend over substantially the entire semiconductor chip, as viewed in the longitudinal direction thereof, to about half.

In the configuration wherein the read-system subamplifier circuit and the write-system CMOS buffer are used as in the embodiment shown in FIG. 5, a core portion of each sub amplifier makes use of the so called π-connected gate-reception differential N channel type MOSFETs Q20 and Q21. Consequently, a small signal on each local input/output signal line LIO can be transmitted to its corresponding main input/output line MIO at high speed (start timing free). The execution of the write operation by the CMOS buffer makes it possible to produce a CMOS amplitude relative to each local input/output line LIO at high speed. Incidentally, since it is near to impossible to lay out the sub amplifiers in each cross area in terms of the number of elements in the configuration wherein the read-system and write-system amplifier circuits are used as in the embodiment, the configuration is suitable for the layout of the sub amplifiers outside the corresponding memory cell array.

Figure 6:
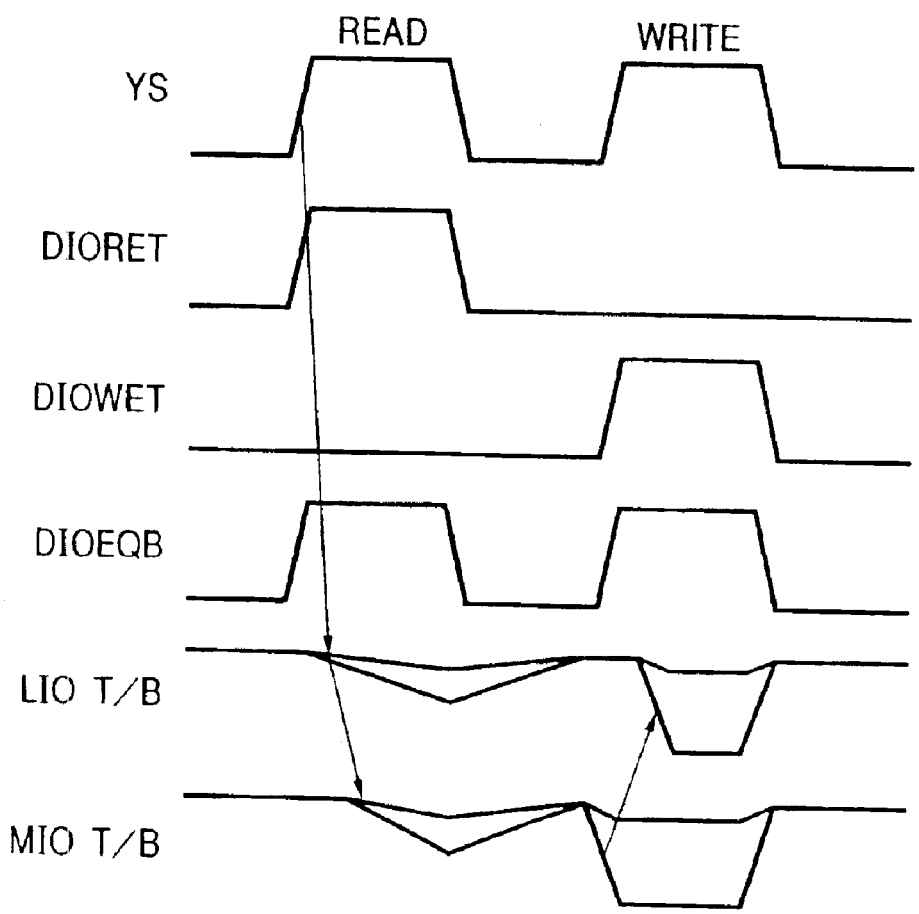
FIG. 6 is a waveform diagram illustrating one example of the operation of the sub amplifier shown in FIG. 5.

A waveform diagram illustrating one example of the operation of the sub amplifier shown in FIG. 5 is shown in FIG. 6. When a column select signal YS is brought to a select level upon a read operation, a signal having small amplitude, corresponding to an output amplified by a sense amplifier SA selected on each local input/output line LIO is outputted. The resultant signal is amplified by the corresponding sub amplifier, followed by propagation to the corresponding main input/output line MIO. Here, the sub amplifier employed in the present embodiment is characterized in that no timing is required between a start timing DIORET of the sub amplifier and the amount of a signal on the local input/output line LIO. This is because, since each sub amplifier employed in the present embodiment is a non-feedback circuit, no data is destroyed even where the amount of the signal on the local input/output line LIO is small. Accordingly, the design of the timing becomes easy and the sub amplifier can be operated at high speed.

For a write operation, data on the main input/output line MIO is propagated to its corresponding local input/output line LIO. Since, at this time, the CMOS buffer employed in the present embodiment buffers the data on the main input/output line MIO and outputs it therefrom, it can be operated at high speed. Further, a start signal DIOWET can be activated in advance, and no timing is needed in a manner similar to the read system.

Figure 7:
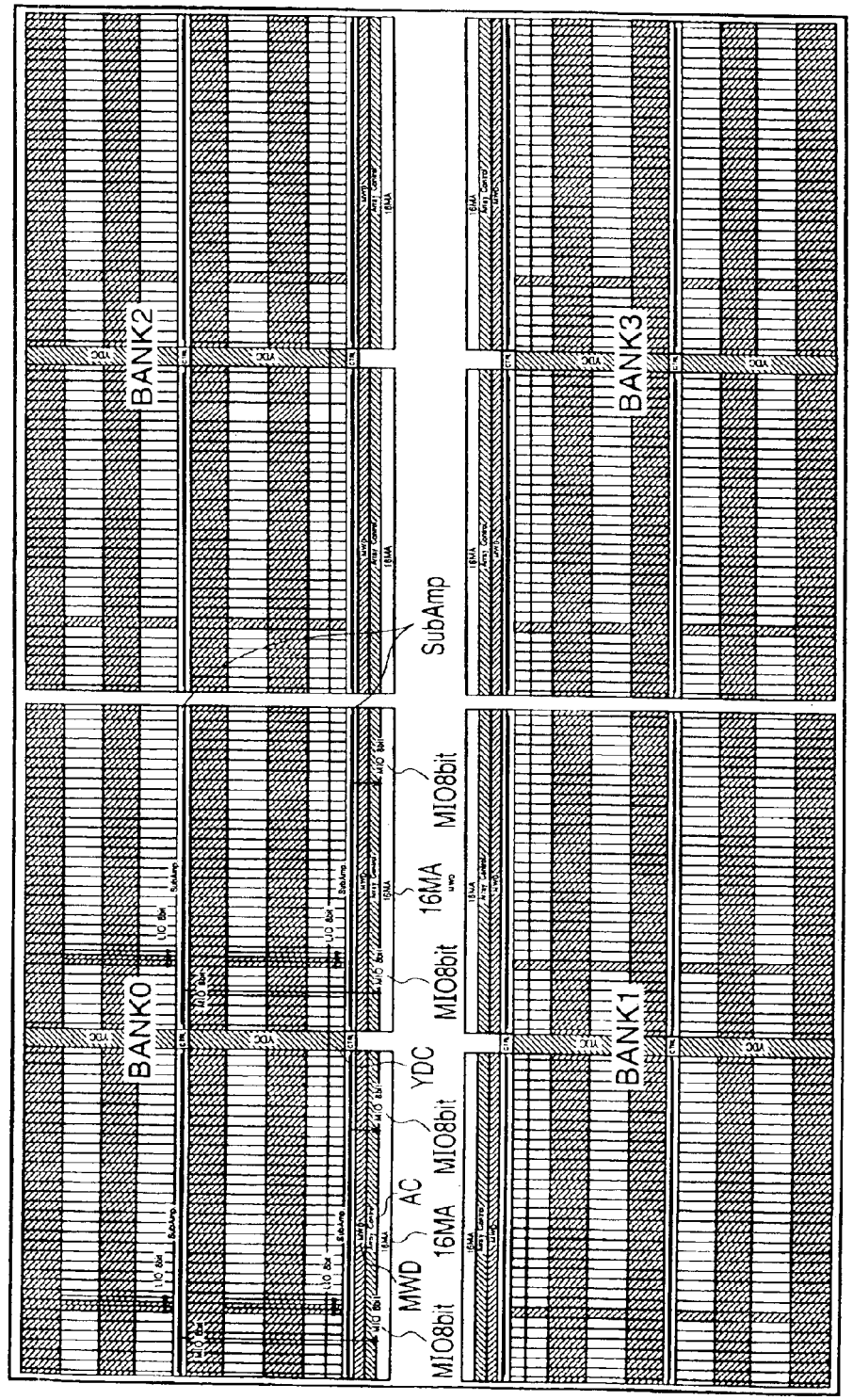
FIG. 7 is a schematic diagram showing the overall layer of a further embodiment of a DRAM according to the present invention.

An overall schematic layout diagram of a further embodiment of a DRAM according to the present invention is shown in FIG. 7. In the present embodiment, sub-amplifier blocks are laid out in two rows, as viewed in central portions of memory cell arrays (memory banks), as viewed in a word-line direction and in the direction of the center of a chip. Although the invention is not restricted in particular, the number of memory arrays (memory mats) is set to 2×2 times that employed in the embodiment shown in FIG. 1. Circuit symbols attached to principal circuit blocks in one memory bank BANK0 are shown in the drawing in enlarged form.

Namely, one memory bank has a storage capacity corresponding to one memory chip shown in FIG. 1 and is divided into two memory blocks with Y decoders YDC as the center. They are respectively provided thirty-two by thirty-two in a bit-line direction as to normal arrays alone. The corresponding block is divided into two by the sub-amplifier block lying in the direction of the center of the chip. They have four memory arrays as viewed in the word-line direction. As a result, the number of the memory arrays is provided as eight in one memory bank, as viewed in the direction in which word lines extend. In regard to the normal arrays alone, the number thereof is provided as sixty-four, as viewed in the bit-line direction. In the case of the memory array in which 1024×512 memory cells are laid out, as described above, the memory array has a storage capacity like about 1G (Giga) bits as a whole.

When the storage capacity is 256 Mbits in a manner similar to the embodiment shown in FIG. 1, one memory array takes a 512×256 bit configuration. The number of memory cells connected to one bit line is reduced like 256, and the number of memory cells connected to one sub-word line is reduced like 512. Therefore, an increase in the amount of a signal read from each memory cell and the speeding up of the operation of selecting each word line make it possible to implement a high-speed DRAM.

Figure 8:
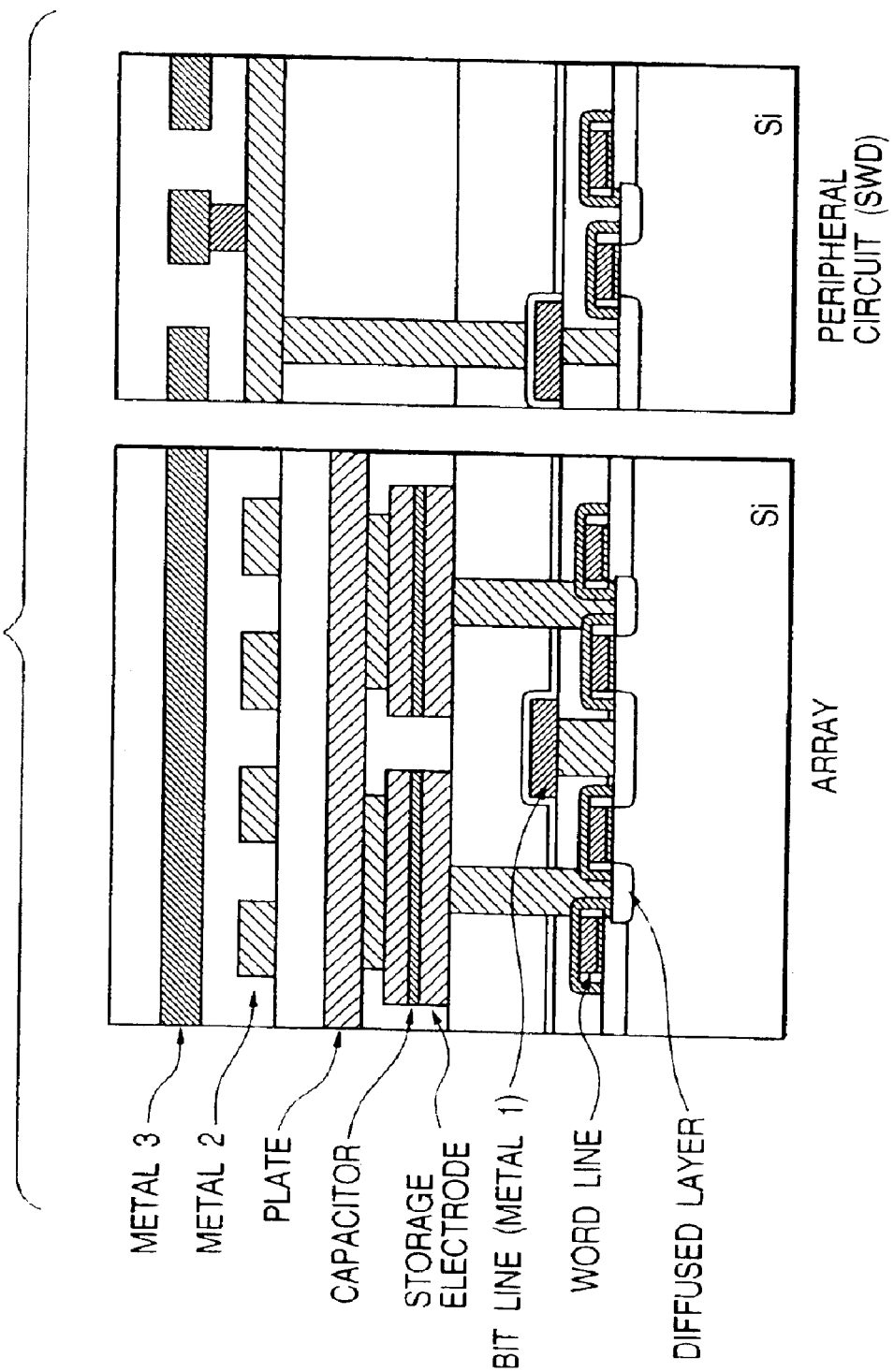
FIG. 8 is a cross-sectional diagram illustrating one embodiment of a DRAM according to the present invention.

A cross-sectional diagram illustrating one embodiment of a DRAM according to the present invention is shown in FIG. 8. An array is provided with MOSFETs for address selection and capacitors for storage, which constitute each memory cell. Word lines are formed integrally with gate electrodes comprised of MOSFETS. A bit line is comprised of a metal wiring (Metal 1: hereinafter called simply "M1") corresponding to a first layer. Each of the storage electrodes of the memory cell is connected to one source or drain diffused layer (activation region) of a MOSFET by a contact for connecting each storage electrode and one source or drain diffused layer thereof, whereas, each bit line is connected to one source or drain diffused layer (activation region) of one MOSFET by a contact for connecting the bit line and one source or drain diffused layer thereof. The metal M1 and each bit line lies in the same wiring layer, and a polysilicon layer FG corresponding to a first layer and each sub-word line WL are also formed in the same wiring layer.

The memory cell makes use of a COB (capacitor over Bitline) structure. Namely, the storage electrodes are provided over the bit line. Thus, since a plate can be formed in one flat form without being cut by the bit line and a connecting portion of the address selection MOSFET within a memory array, the resistance of the plate can be reduced. Although the invention is not restricted in particular, the plate has the advantage of taking on a laminated structure using PL(D) and PL(U) and being capable of lowering the sheet resistance value thereof. Now, a case will be considered in which a high dielectric film, such as BST or $Ta_2O_5$, is used for a capacitive insulating film of each capacitor, as one example. When Ru is used for the storage node and upper-electrode lower layer in this case, the capacity of the capacitor can be increased. Since Ru is low in sheet resistance value as compared with poly Si, the resistance value of each plate electrode PL can be reduced.

Further, when W is stacked on this structure as the plate PL(U), the resistance value of the plate can further be reduced. When the resistance value of the plate per se is lowered in this way, the speed of canceling out noise lying on the plate is made fast, and, hence the noise developed in the plate can be reduced. Further, TiN may be used as the plate PL (D) Even in this case, an effect similar to the above can be obtained.

Metal wirings (Metal 2 and Metal 3: hereinafter called simply "M2 and M3") corresponding to second and third layers extend as wirings on the memory array and are respectively used as a main word line MWL and a column select line YS. Since, however, wirings equivalent to twice the total number of the main word lines MWL and YS lines can be used if the wiring pitch and the required number of wirings are taken into consideration, a mesh-like power-supply network is normally constructed on the array through power lines on alternate wirings.

In the present embodiment, some of the power lines are assigned to main input/output lines MIO and local input/output lines LIO, respectively. Namely, local input-/output line LIO wirings for guiding main input/output lines MIO which cross the memory cell array in the word-line direction, and local input/output lines LIO formed in the sense amplifier areas of the arrays 2 and 3 to their corresponding sub amplifiers are passed between the main word lines (metal wirings M2). In the present embodiment, main input/output lines MIO and sub-word driver select signal lines FX are caused to normally pass through the metal wiring M3 on each sub-word driver. Further, the metal wirings M2 are used to allow the main word lines MWL and power lines to pass therethrough.

Figure 9:
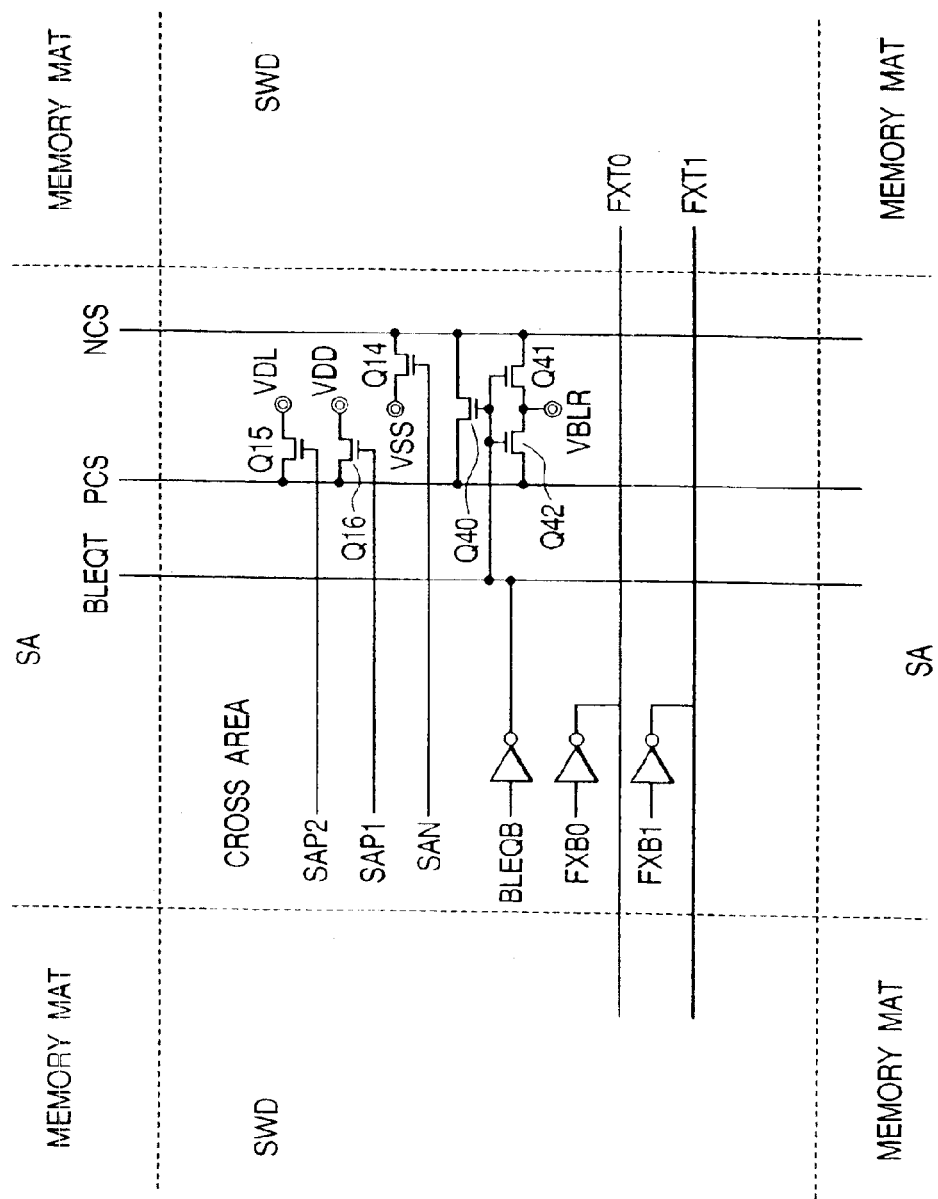
FIG. 9 is a circuit diagram showing a circuit provided in a cross area in a DRAM according to the present invention.

A circuit diagram of a cross area employed in a DRAM according to the present invention is shown in FIG. 9. When sub amplifiers are disposed outside a memory cell array, as in the present embodiment, an N channel type driver MOSFET Q15 for supplying an operating voltage VDL to a P channel type MOSFET of a sense amplifier used as a drive circuit thereof, an N channel type MOSFET Q16 for supplying an over-driving voltage like VDD to a P channel type MOSFET Q16 of the sense amplifier, and an N channel type MOSFET Q14 for supplying a circuit's ground voltage VSS to an N channel type MOSFET of the sense amplifier are provided in a cross area where sub-word driver areas SWD and sense amplifier areas SA intersect.

There are provided a precharge circuit comprised of N channel type MOSFETs Q40 through Q42 for precharging a common source line NCS for the N channel type MOSFETs constituting the sense amplifier and a common source line PCS for the P channel type MOSFETs constituting the sense amplifier to an intermediate voltage VBLR during a precharge, a driving inverter circuit for supplying a precharge signal BLEQT to be supplied to the precharge circuit, and driving inverter circuits for forming sub-word line select signals FXB0 and FXBL supplied to the sub-word drivers. As a result of the elimination of the need for the layout of the sub amplifiers in the cross area in this way, only circuits for controlling each sense amplifier and sub-word driver exist as circuits left in the cross area.

Figure 10:
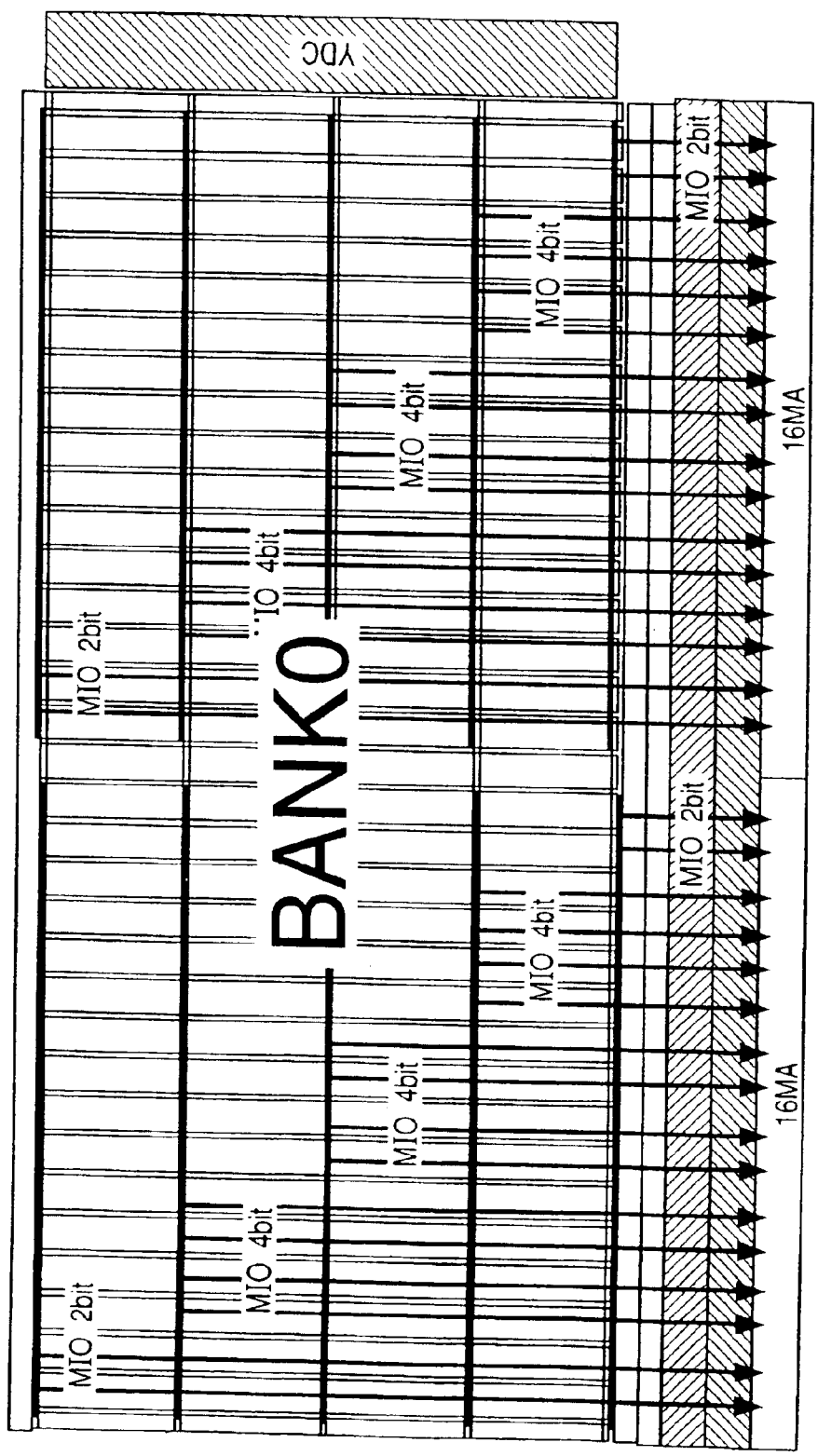
FIG. 10 is a schematic diagram illustrating the overall layout of a still further embodiment of a DRAM according to the present invention.

A schematic diagram of the overall layout of a still further embodiment of a DRAM according to the present invention is shown in FIG. 10. In the present embodiment, sub amplifiers are distributedly disposed in each cross area. Namely, main input/output lines MIO are distributively disposed on each sub-word driver area, and sub amplifiers are placed at portions where the main input/output lines MIO intersect local input/output lines LIO provided in each sense amplifier area. The main input/output lines MIO are connected to their corresponding main amplifiers MA disposed in the direction orthogonal to a Y decoder YDC, i.e., placed side by side with main word drivers and array control circuits so as to pass over each array, thereby making it possible to obtain a similar effect.

When the main amplifiers are disposed on the Y decoder YDC side, wirings are provided for guiding main input/output lines LIO of the other memory block in each sub-word driver area, as well as main input/output lines MIO of one memory block itself provided adjacent to the Y decoder circuit in the sub-word driver area, to the main amplifiers provided adjacent to the Y decoder circuit YDC. Therefore, signal lines for transmitting read and write signals, and column select lines YS for connecting local input/output lines LIO and bit lines extend in parallel in each memory block provided adjacent to the Y decoder circuit YDC.

Since the two obtain read signals through the main input/output lines MIO while switching is being done between column switches of each memory array in a burst mode, a signal on a column select line YS is put on a signal transmitted over the main input/output lines MIO as noise, thereby degrading the operating margin. On the other hand, the configuration, wherein the main input/output lines MIO are connected to their corresponding main amplifiers MA disposed in the direction orthogonal to the Y decoder YDC, i.e., placed side by side with the main word drivers and array control circuits so as to pass over each array as in the present embodiment, is little affected by noise produced from each column select line YS and is capable of achieving an improvement in operating margin.

Figure 11:
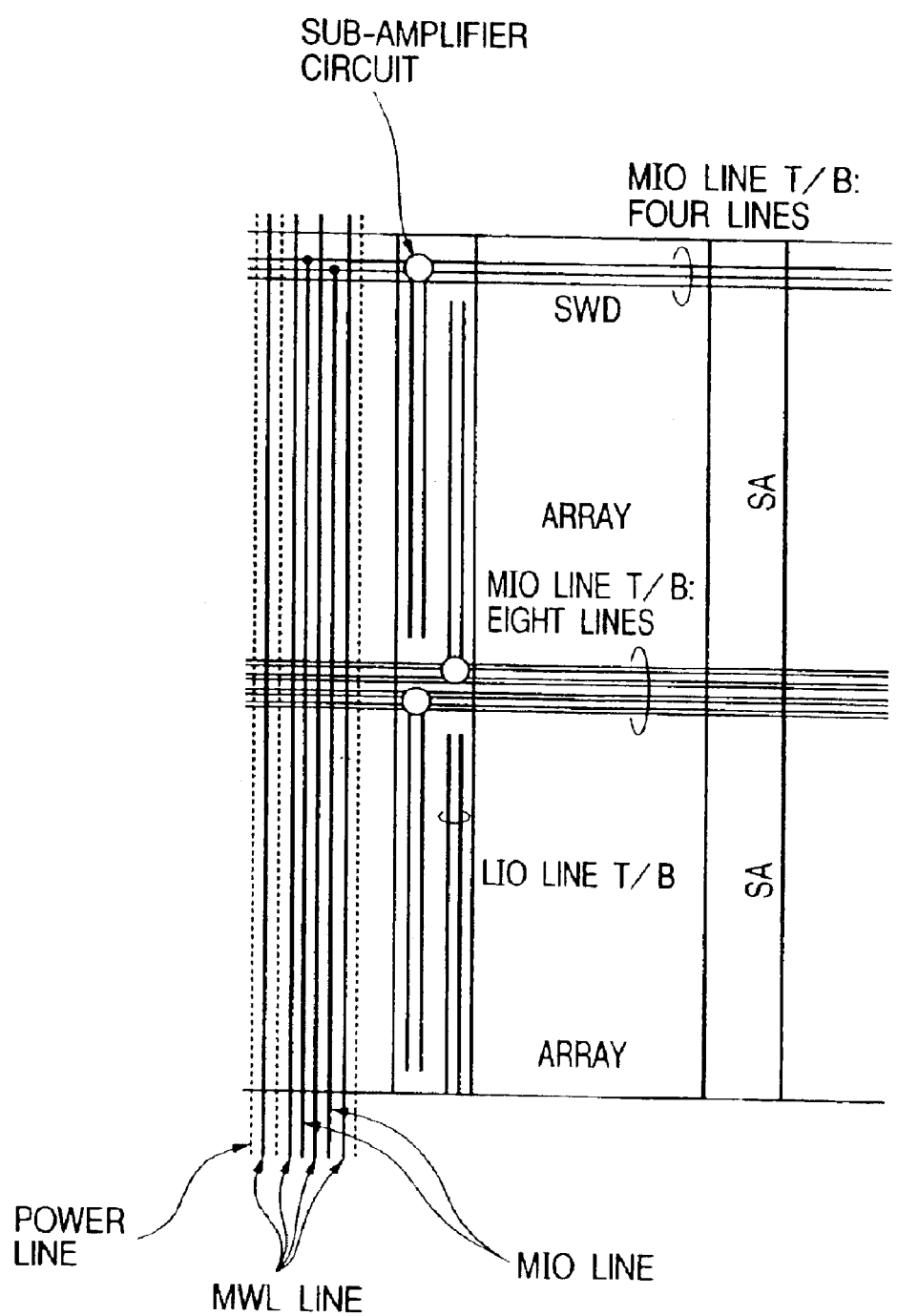
FIG. 11 is a layout diagram depicting one enlarged embodiment on arrays in FIG. 10.

An enlarged layout diagram of the arrays, which is associated with the embodiment shown in FIG. 10, is shown in FIG. 11. Wirings for main input/output lines MIO are principally drawn in the same figure as the center. Main word lines MWL and power lines extend on the arrays through the use of metal wirings M2 corresponding to a second layer. However, some of the power lines are thinned out to allow main input/output lines MIO, to be guided to the main amplifiers MA, to pass.

Namely, local input/output lines LIO provided in association with bit lines on each array are extended on sense amplifier areas SA. Sub amplifiers are respectively placed in cross areas where the sense amplifier areas SA and their corresponding sub-word driver areas SWD intersect. Main input/output lines MIO on the sub-word driver areas SWD and the local input/output lines LIO are selectively connected to one another. The metal wirings M2 are used in wirings for connecting the main input/output lines MIO provided on the sub-word driver areas SWD and the main amplifiers MA. Since the number of the main input/output lines MIO that cross over such arrays is overwhelmingly low as compared with the number of the power lines, the influence of thinning-out of the power lines is low and hence no problem arises.

Figure 12:
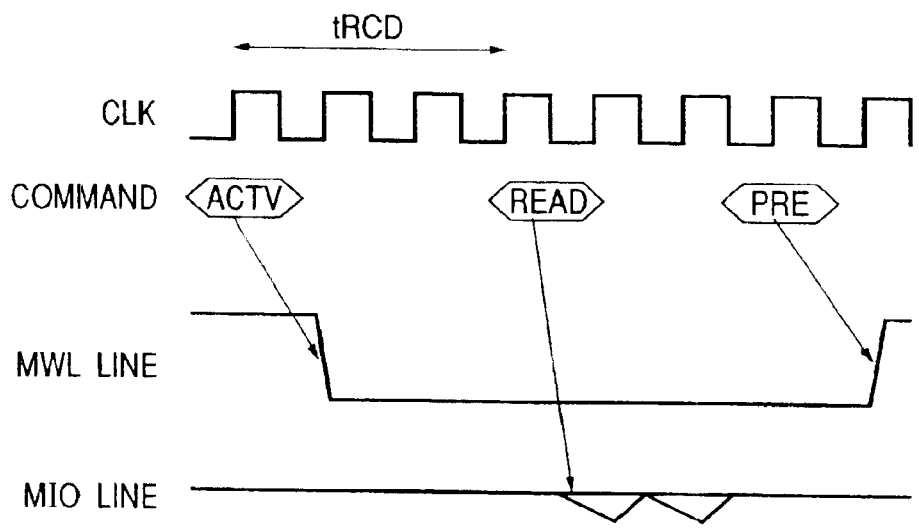
FIG. 12 is a timing chart illustrating one example of the operation of the DRAM shown in FIG. 11.

A timing chart illustrating one example of the operation of the DRAM shown in FIG. 11 is shown in FIG. 12. A specific main word line of the main word lines MWL is changed from a non-selection level to a selection level since a bank active command ACTV is inputted, whereas signals transmitted to the corresponding main input/output lines MIO change after switching is performed between column switches in synchronism with a clock signal CLK following the input of a read command or the like. Thus, even if these signals are alternately placed on the arrays, a decrease in operating margin due to line-to-line noise does not occur.

In a configuration wherein, for example, main amplifiers MA are placed in an area on the Y decoder YDC side and connected to main input/output lines MIO so as to pass over sub-word driver areas in FIG. 11, mats are selected for each individual memory block of two memory blocks, where one memory block is divided into the two memory blocks as described above. Therefore, the number of simultaneous activated mat sequences or arrays results in two. It is necessary to take out different main input/output lines MIO from the respective mats. It is also necessary to allow main input/output lines of the other memory block in addition to main input/output lines MIO of one memory block itself provided adjacent to the Y decoder circuit YDC to pass over sub-word drivers. Thus, the number of the main input/output lines MIO that pass over their corresponding sub-word drivers increases.

Such a configuration further presents a problem as the memory capacity increases and the simultaneous activated-mat sequence or array increases. However, in the layout of the main amplifiers MA, such as described in the embodiment shown in FIG. 1 and the configuration wherein the main input/output lines MIO which cross over the arrays are provided, the main input/output lines MIO that pass over the sub-word drivers result in only the number of the main input/output lines necessary for their own memory block. Even if the simultaneous activated-mat sequence or array increases, the number thereof does not increase.

Figure 13:
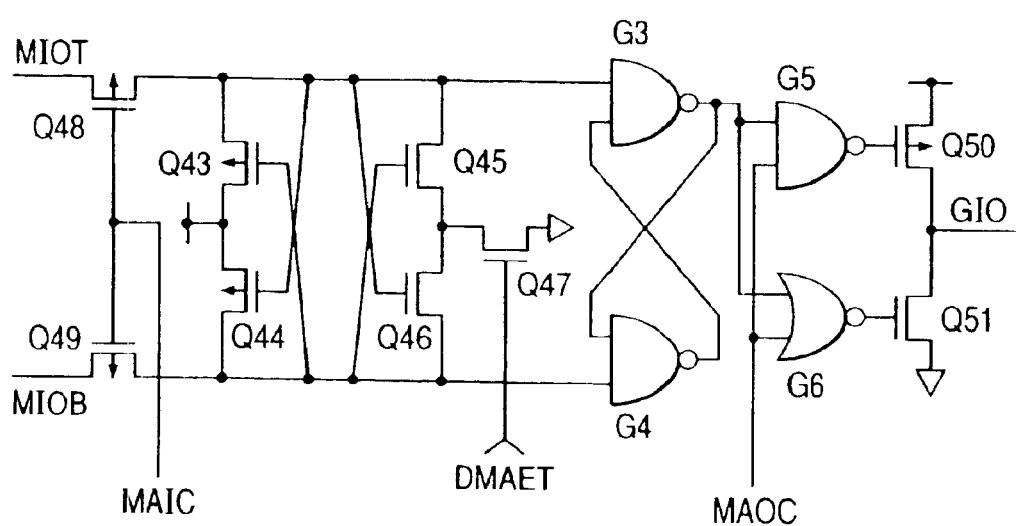
FIG. 13 is a circuit diagram showing one embodiment of a main amplifier employed in a DRAM according to the present invention.

A circuit diagram of one embodiment of a main amplifier employed in a DRAM according to the present invention is shown in FIG. 13. In the present embodiment, a read-system amplifier circuit is illustratively shown as being typical. Read signals transmitted to main input/output lines MIOT and MIOB, to which complementary signals are transferred, are captured through a pass gate comprised of switch MOSFETs Q48 and Q49 controlled by an input take-in or capture timing signal MAIC. The input signals are amplified by a CMOS latch circuit comprised of P channel type MOSFETs Q43 and Q44 and N channel type MOSFETs Q45 and Q46, each brought into an operating state by an activation signal DMAET and held in a register comprised of NAND gate circuits G3 and G4. An output signal to be transmitted to a global input/output line GIO through a CMOS buffer comprised of a P channel type MOSFET Q50 and an N channel type MOSFET Q51 is formed through an output control circuit which comprises a NAND gate circuit G5 and a NOR gate circuit G6 and is controlled by an output timing signal MAOC.

In the present application, the term "MOS" is understood as referring to a metal oxide semiconductor configuration originally used for simplicity or brevity. However, the recent generally-named MOSs include those obtained by changing a metal of essential portions of a semiconductor device to an electrical conductor, such as polysilicon, which does not belong to the metal, and changing the oxide to another insulator. Also CMOSs are now understood as having a wide technical meaning corresponding to a change in how to grasp the MOSs referred to above. MOSFETs are also similarly taken as the meaning including such a wide construction as substantially taken as an insulated-gate field effect transistor without being understood in a narrow sense. CMOSS, MOSFETS, etc. employed in accordance with the present invention follow the general designation referred to above.

Figure 14A:
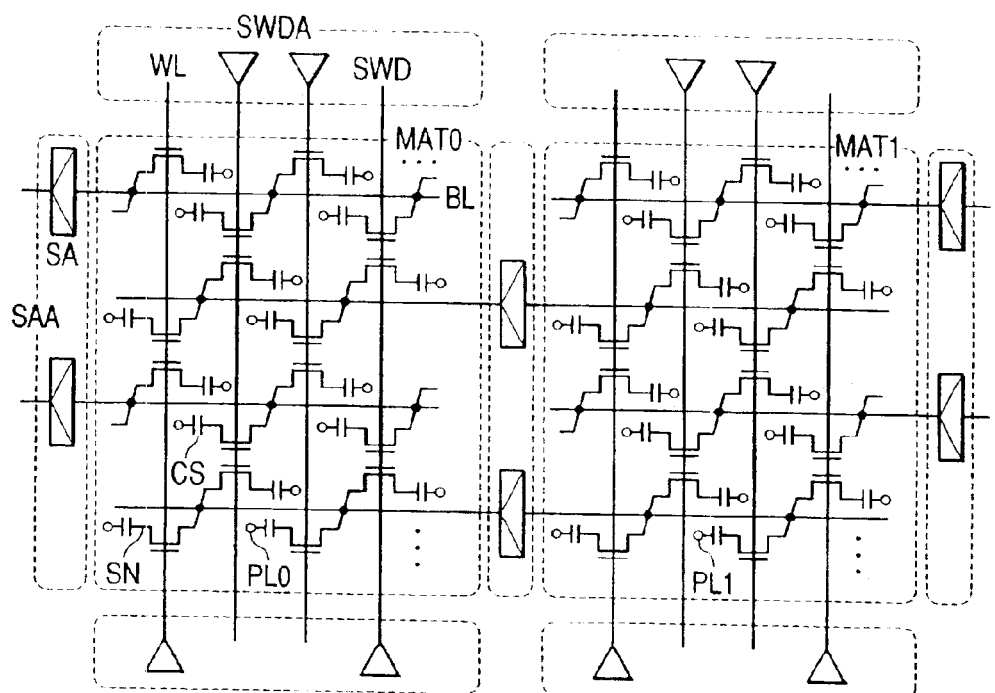
FIGS. 14A and 14B are, respectively, schematic diagrams illustrating one embodiment of memory mats of a DRAM according to the present invention.
Figure 14B:
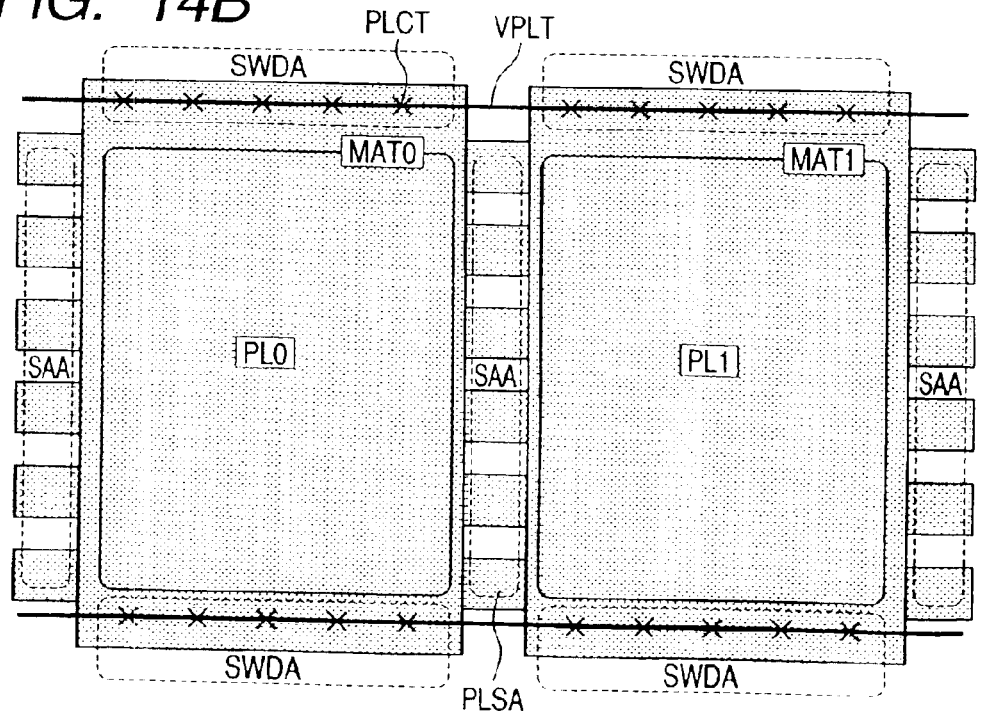

FIGS. 14A and 14B are respectively configurational views of one embodiment illustrating the use of memory mats of a DRAM according to the present invention. FIG. 14A shows circuits associated with two memory mats MAT0 and MAT1 provided in the DRAM of the hierarchical word-line system, such as shown in FIG. 1, and FIG. 14B shows layouts corresponding thereto. In FIG. 14A, memory cells MCs each comprising a MOSFET and a cell capacitor or capacitance CS are respectively connected to all points where bit lines BL and sub-word lines WL intersect. Each sense amplifier SA is electrically connected to the bit lines BL, whereas sub-word drivers SWD are electrically connected to the word lines WL.

In the present embodiment, four sub-word lines are arranged for each main word line in a complementary bit-line direction to decrease the number of the main word lines, in other words, to reduce the wiring pitch of each main word line, although the invention is not restricted in particular. A sub-word selection driver is provided to select one sub-word line from the sub-word lines divided into two in a main word-line direction and assigned in the complementary bit-line direction by four as referred to above. This sub-word selection driver produces a signal for selecting one from the four sub-word select lines which extend in the direction of an arrangement of the sub-word drivers (sub-word driver arrays SWDA). Although not shown in the drawing, the main word lines MWL are extended in parallel with the sub-word lines WL. Although not shown in the drawing, each column selection line YS is disposed in parallel with the direction of extension of each bit line BL orthogonal thereto.

The sense amplifiers SA of a sense amplifier array SAA provided between the two memory mats MAT0 and MAT1 are connected to their corresponding complementary bit lines so as to extend to both sides of the two memory mats MAT0 and MAT1. As to these sense amplifiers SA, one sense amplifier SA is arranged every two bit lines in the sense amplifier array SAA, although the invention is not restricted in particular. Thus, the sense amplifier array SAA provided between the two memory mats MAT0 and MAT1 is provided with 512 sense amplifiers SA corresponding to half of the 1024 bit lines, where 1024 bit lines exist.

In the memory mat MAT0, the remaining 512 bit lines are connected to their corresponding sense amplifiers SA provided in a sense amplifier array SAA on the side opposite to the memory mat MAT1. In the memory mat MAT1, the remaining 512 bit lines are connected to their corresponding sense amplifiers SA provided in a sense amplifier array SAA provided on the side opposite to the memory mat MAT0. According to the dispersed placement or layout of such sense amplifiers SA on both sides thereof as viewed in the bit-line direction, respective sense amplifiers may distributedly be formed at both ends thereof on an alternate basis every two bit lines. Therefore, the memory mats and the sense amplifier arrays can be formed with high density so as to cause the pitches of the sense amplifier SA and the bit line BL to coincide with each other.

This is similar even to the sub-word drivers SWD. 512 sub-word lines WL provided in the memory mat MAT0 are divided 256 by 256, which in turn are connected to their corresponding 256 sub-word drivers SWD of the sub-word driver arrays SWDA placed on both sides of the memory mat MAT0. In the present embodiment, the sub-word drivers SWD provided two by two are dispersively placed with two sub-word lines WL as each pair. Namely, two sub-word drivers are placed on the one-end side (on the upper side in the drawing) of the memory mat MAT0 with the sub-word lines corresponding to two memory cells which share the use of a portion connected to each bit line, as one pair; whereas, two sub-word drivers are placed on the other end side (on the lower side in the drawing) of the memory mat MAT0 with the similar two sub-word lines adjacent thereto as one pair.

Although not shown in the drawing, the sub-word drivers SWD form or produce signals for selecting sub-word lines for memory mats provided on both sides, with the sub-word driver array SWDA in which the sub-word drivers are formed being interposed therebetween. Thus, the sub-word drivers SWD can be dispersively placed with satisfactory efficiency in association with the sub-word lines, each formed so as to coincide with an array pitch of each memory cell, and the operation of selecting each sub-word line WL can be carried out at high speed.

Memory cells MC are respectively formed at points where the bit lines BL and sub-word lines WL included in the memory mats MAT0 and MAT1 or the like surrounded by the sub-word driver arrays SWDA and sense amplifier arrays SAA referred to above. In the memory mat MAT0 with the respective memory cells MC formed therein, upper electrodes (plate electrodes) PL of storage capacitors CS are formed in common between all the memory cells MC in the memory mats MAT0 and MAT1 as planar electrodes, as shown in FIG. 14B. The supply of power to the plate electrodes PL is carried out at the boundary between the sub-word driver array SWDA and each of the memory mats MAT0 and MAT1 through a connecting portion PLCT from a power wiring VPLT wired in the direction of extension of each bit line BL. In the drawing, storage nodes SN are respectively lower electrodes of the storage capacitors CS and indicate portions for connection to address selection MOSFETS.

In the present embodiment, the above-described plate electrodes PLO and PL1 respectively formed in the memory mats MAT0 and MAT1 provided on both sides of each sense amplifier array SAA are connected to one another by wirings PLSA using a plate layer itself. Further, the wirings PLSA are provided in plural form so as to penetrate the sense amplifier arrays SAA, thereby greatly reducing the resistance between the two plate electrodes PLO and PL1. Thus, phase-reversal noise developed in the plate electrodes PLO and PL1, when a small signal read from each memory cell MC selected between complementary bit lines BL for the memory mats MAT0 and MAT1 is amplified by the corresponding sense amplifier SA, can be canceled out at high speed, thereby making it possible to greatly reduce the noise produced in the plate electrodes PLO and PL1.

Figure 15:
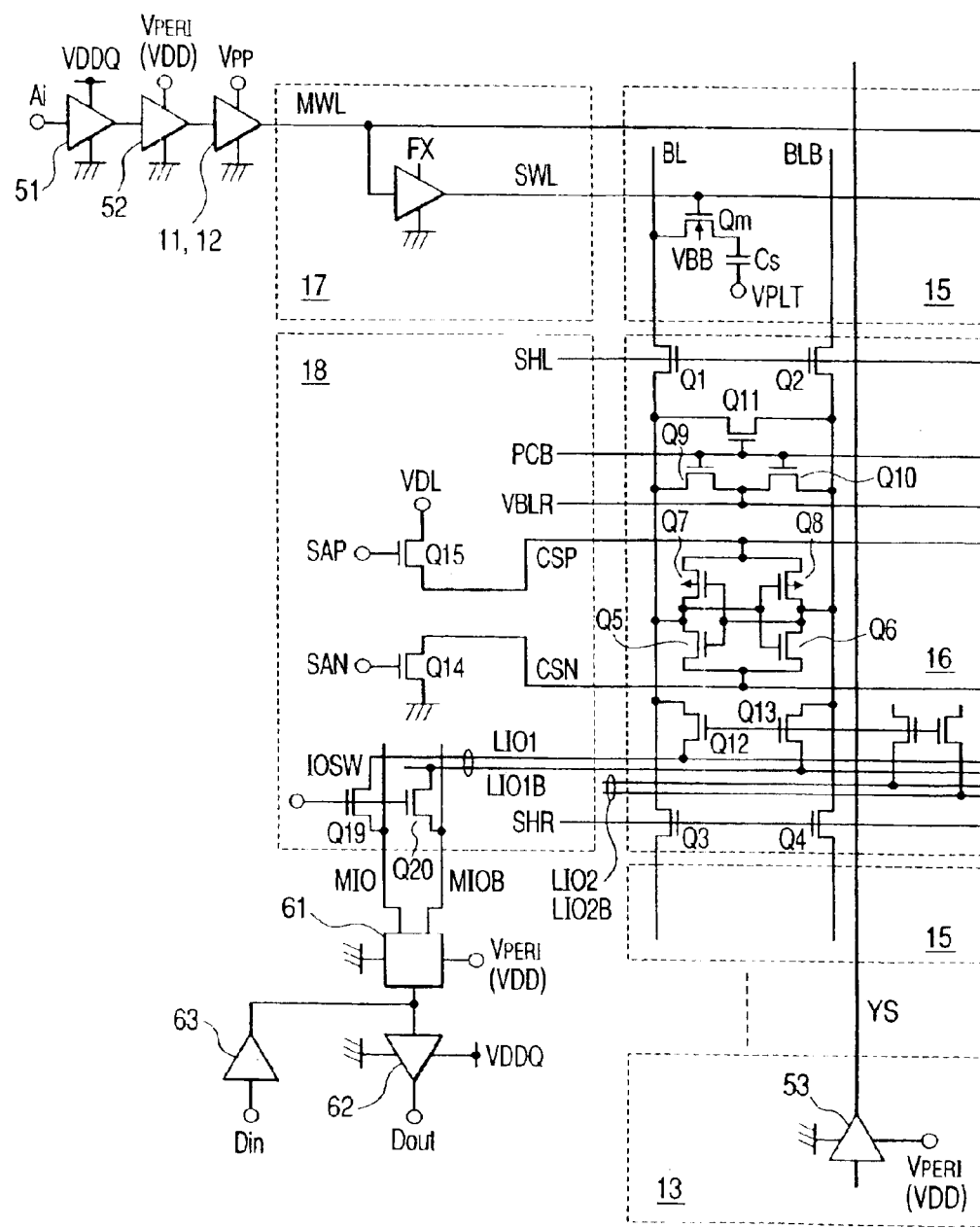
FIG. 15 is a circuit diagram showing a still further embodiment of a dynamic RAM according to the present invention.

A circuit diagram showing a still further embodiment of a dynamic RAM according to the present invention is shown in FIG. 15. A simplified circuit diagram from an address input to a data output is illustratively shown in the drawing with a sense amplifier section of the dynamic RAM as the center. The present embodiment is intended for a so-called two-intersection system in which a pair of complementary bit lines is folded back and extended in parallel with each sense amplifier as the center. In the drawing, a sense amplifier 16 interposed between two sub-arrays 15 from above and below, and a circuit provided in a cross area 18 are shown by way of illustrative example, and others are shown as block diagrams.

One dynamic memory cell provided between a sub-word line SWL provided in one sub-array 15 referred to above and one BL of complementary bit lines BL and BLB is shown by way of illustrative example as being typical. The dynamic memory cell comprises an address selection MOSFET Qm and a storage capacitor Cs. The gate of the address selection MOSFET Qm is electrically connected to its corresponding sub-word line SWL, the drain thereof is electrically connected to its corresponding bit line BL, and the source thereof is electrically connected with the storage capacitor Cs. The other electrode of the storage capacitor Cs is used in common and is supplied with a plate voltage VPLT. A negative back bias voltage VBB is applied to a substrate (channel) of the MOSFET Qm. Although the invention is not restricted in particular, the back bias voltage VBB is set to a voltage like −1V. The level for selecting the sub-word line SWL is set to a high voltage VPP increased by a threshold voltage of the address selection MOSFET Qm from a high level on the bit line.

When the sense amplifier is activated by an internal de-boosted voltage VDL, a high level amplified by the sense amplifier and supplied to the corresponding bit line is set to the internal voltage VDL level. Accordingly, the high voltage VPP corresponding to the selected level of the word line is set to VDL+Vth+α. The pair of complementary bit lines BL and BLB provided on the left side of the sense amplifier is placed in parallel as shown in the drawing. The complementary bit lines BL and BLB are electrically connected to their corresponding input/output nodes of a unit circuit of the sense amplifier by shared switches MOSFETs Q1 and Q2.

The unit circuit of the sense amplifier comprises a CMOS latch circuit comprised of N channel type amplifying MOSFETs Q5 and Q6 and P channel type amplifying MOSFETs Q7 and Q8 whose respective gates and drains are cross-connected to one another so that they may be brought into latch form. The sources of the N channel type MOSFETs Q5 and Q6 are respectively electrically connected to a common source line CSN. The sources of the P channel type MOSFETs Q7 and Q8 are respectively electrically connected to a common source line CSP. Power switch MOSFETs are respectively electrically connected to the common source lines CSN and CSP.

Although the invention is not restricted in particular, the common source line CSN electrically connected to the sources of the N channel type amplifying MOSFETs Q5 and Q6 is supplied with an operating voltage corresponding to a ground potential by an N channel type power switch MOSFET Q14 provided in the cross area 18. Similarly, an N channel type power MOSFET Q15 for supplying the internal voltage VDL is provided for the common source line CSP to which the sources of the P channel type amplifying MOSFETs Q7 and Q8 are connected. The power switch MOSFETs may distributively be provided for the respective unit circuits.

Sense amplifier activation signals SAN and SAP supplied to the gates of the N channel type power MOSFETs Q14 and Q15 are respectively defined as in-phase signals, each brought to a high level upon activation of the sense amplifier. The high level of the SAP is defined as a signal having a boosted voltage VPP level. Since the boosted voltage VPP is set to about 3.6V when VDL is 1.8V, the N channel type MOSFET Q15 is brought to an on state sufficiently, so that the common source line CSP can be brought to the internal voltage VDL.

A precharge (equalize) circuit comprised of an equalize MOSFET Q11 for short-circuiting the complementary bit lines and switch MOSFETs Q9 and Q10 for supplying a half precharge voltage VBLR to the complementary bit lines is provided at the input/output nodes of the unit circuit of the sense amplifier. The gates of these MOSFETs Q9 through Q11 are supplied with a precharge signal PCB in common. With respect to a driver circuit for forming or producing the precharge signal PCB, an inverter circuit is provided in the cross area to make the falling or rising edge of the precharge signal fast, although this is not shown in the drawing. In other words, prior to the timing for selecting the corresponding word line upon the start of a memory access, each of the MOSFETs Q9 through Q11 constituting the precharge circuit is selected at a high speed through each of the inverter circuits provided in distributed form in the respective cross areas.

An IO switch circuit IOSW (switch MOSFETs Q19 and Q20 for connecting local IOs and main IOs to one another) is placed in the cross area 18. Further, the cross area 18 also includes a half precharge circuit used for each of the common source lines CSP and CSN for each sense amplifier, a half precharge circuit for each local input/output line LIO, a VDL precharge circuit for each main input/output line, a dispersive driver circuit for each of shared select signal lines SHR and SHL, etc. as described above.

The unit circuit of the sense amplifier is electrically connected to similar complementary bit lines BL and BLB of the sub-array 15 provided on the lower side in the drawing through shared switch MOSFETs Q3 and Q4. When, for example, the corresponding sub-word line SWL of the sub-array 15 on the upper side is selected, the shared switch MOSFETs Q1 and Q2 on the upper side of the sense amplifier are held on and the shared switch MOSFETs Q3 and Q4 on the lower side thereof are turned off. Switch MOSFETs Q12 and Q13 constitute a column (Y) switch circuit. When the select signal YS is set to a select level (high level), they are turned on so that the input/output nodes of the unit circuit of the sense amplifier and local input/output lines LI01, LI01B, LI02, LI02B, etc. are electrically connected to one another.

Thus, the input/output nodes of the sense amplifier are electrically connected to the complementary bit lines BL and BLB on the upper side so that a small signal of the memory cell electrically connected to the selected sub-word line SWL is amplified. Thereafter, the amplified signal is transmitted to the local input/output lines LI01 and LI01B through the column switch circuit (Q12 and Q13). The local input/output lines LI01 and LI01B are extended along the sense amplifier sequence or array, i.e., in the transverse direction in the drawing. The local input/output lines LI01 and LI01B are electrically connected to the main input/output lines MIO and MIOB, each connected to an input terminal of a main amplifier 61 through the IO switch circuit comprised of the N channel type MOSFETs Q19 and Q20 provided in the cross area 18.

The IO switch circuit is switch-controlled by a select signal formed by decoding an X-system address signal. Incidentally, the IO switch circuit may take a CMOS switch configuration wherein P channel type MOSFETs are electrically connected in shunt with the N channel type MOSFETs Q19 and Q20, respectively. In a burst mode of a synchronous DRAM, the column select signal YS is changed over according to a counter operation to successively perform switching of electrical connections between the local input/output lines LI01, LI01B and LI02, LI02B and the complementary bit lines BL and BLB of the sub-array, which are provided by two pairs.

An address signal Ai is supplied to an address buffer 51. The address buffer 51 is activated on a time-shared basis to take in or capture an X address signal and a Y address signal. The X address signal is supplied to a predecoder 52 so that a select signal for a main word line MWL is formed through a main row decoder 11 and a main word driver 12. Since the address buffer 51 receives the address signal Ai supplied from an external terminal therein, it is activated based on a source voltage VDDQ supplied from an external terminal. The predecoder 52 is activated based on a voltage VPERI (VDD) obtained by de-boosting it, and the main word driver 12 is activated based on the boosted voltage VPP. A logic circuit having a level converting function, which receives the predecode signal therein, is used as the main word driver 12. A column decoder (driver) 53 includes a drive circuit whose operating voltage is formed by the MOSFET Q23 constituting the VCLP generating circuit, and forms the select signal YS in response to a Y address signal supplied according to the time-shared operation of the address buffer 51.

The main amplifier 61 is activated based on the de-boosted voltage VPERI (VDD). Thus, the output of the main amplifier 61 is outputted from an external terminal Dout through an output buffer 62 activated based on the source voltage VDDQ supplied from the external terminal. A write signal inputted from an external terminal Din is captured through an input buffer 63. Further, the write signal is supplied to the main input/output lines MIO and MIOB through a write amplifier (write driver) included in the main amplifier 61. A level shift circuit and a logic unit for synchronizing a signal outputted from the level shift circuit with a timing signal corresponding to the clock signal and outputting the synchronized signal therefrom are provided at the input of the output buffer 62.

Although the invention is not restricted in particular, the source voltage VDDQ supplied from the external terminal is set to 3.3V in a first form, the de-boosted voltage VPERI (VDD) supplied to the internal circuit is set to 2.5V, and the operating voltage VDL of the sense amplifier is set to 1.8V. Further, the word-line select signal (boosted voltage) is set to 3.6V. A precharge-voltage VBLR for each bit line is set to 0.9V corresponding to VDL/2 and a plate voltage VPLT is also set to 0.9V. Further, a substrate voltage VBB is set to −1.0V. The source voltage VDDQ supplied from the external terminal may be set to a low voltage like 2.5V as a second form. When such a low source voltage VDDQ is adopted, the de-boosted voltage VPERI (VDD) and the de-boosted voltage VDL may be set identical to about 1.8V.

Alternatively, the source voltage VDDQ supplied from the external terminal may be set to 3.3V, and the de-boosted voltage VPERI (VDD) supplied to the internal circuit and the operating voltage VDL of the sense amplifier may equally be set to 2.0V or 1.8V. Thus, the internal voltage with respect to the external source voltage VDDQ can take various embodiments.

Figure 16:
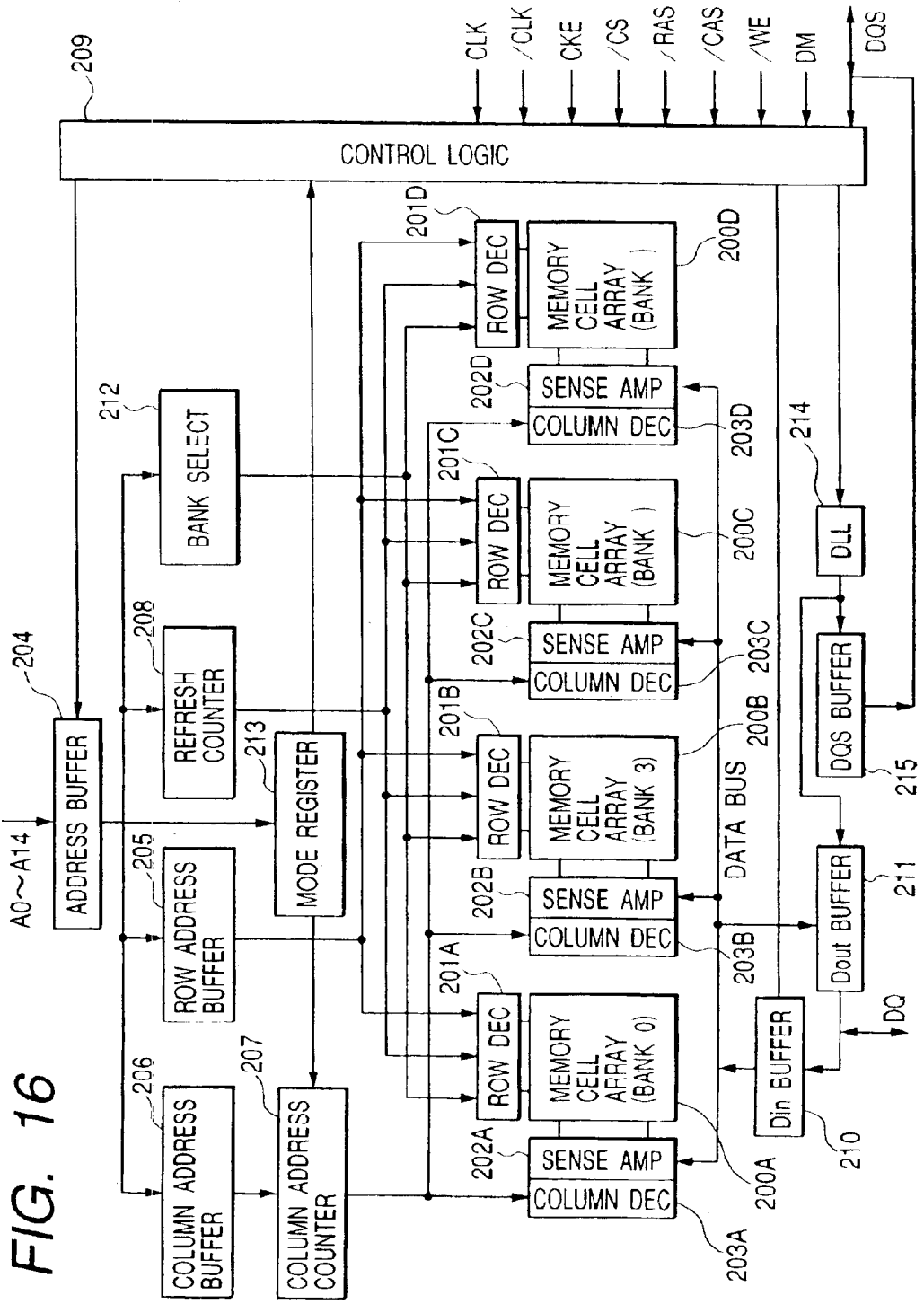
FIG. 16 is a block diagram illustrating one embodiment of a dynamic RAM according to the present invention.

A block diagram showing one embodiment of a dynamic RAM according to the present invention is shown in FIG. 16. The dynamic RAM according to present embodiment is intended for a DDR SDRAM (Double Data Rate Synchronous Dynamic Random Access Memory; hereinafter called simply "DDR SDRAM"). Although the invention is not restricted in particular, the DDR SDRAM according to the present embodiment is provided with four memory cell arrays 200A through 200D in association with four memory banks. The memory cell arrays 200A through 200D respectively associated with the four memory banks 0 through 3 are equipped with dynamic memory cells arranged in matrix form. According to the drawing, selection terminals of memory cells placed in the same column are connected to their corresponding word lines (not shown) set every column, and data input/output terminals of memory cells placed in the same row are connected to complementary data lines (not shown) set at every row.

One of unillustrated word lines in the memory cell array 200A is driven to a selection level according to the result of decoding each row address signal by a row decoder (Row DEC) 201A. Unillustrated complementary data lines in the memory cell array 200A are coupled to their corresponding I/O lines of a sense amplifier (Sense AMP) 202A and a column selection circuit (Column Dec) 203A. The sense amplifier 202A is a circuit for detecting small potential differences which appear on the respective complementary data lines according to the reading of data from memory cells and amplifying the same. The column selection circuit 203A provided for the sense amplifier 202A includes a switch circuit for selecting the complementary data lines separately and bringing the selected ones and complementary I/O lines into conduction. The column switch circuit is selectively operated according to the result of decoding of each column address signal by the column decoder 203A.

The memory cell arrays 200B through 200D are also similarly provided with row decoders 201B through 201D, sense amplifiers 203B through 203D and column selection circuits 203B through 203D, respectively. The complementary I/O lines are shared among the respective memory banks and are connected to an output terminal of a data input/output circuit (Din Buffer) 210 having a write buffer and an input terminal of a data output circuit (Dout Buffer) 211 including a main amplifier. Although the invention is not restricted in particular, a terminal DQ serves as a data input/output terminal for inputting or outputting data DO through D15 comprising 16 bits. A DQS buffer (DQS buffer) 215 forms or produces a data strobe signal for data outputted from the terminal DQ at the time of a read operation.

Address signals A0 through A14 supplied from an address input terminal are temporarily stored in an address buffer (Address Buffer) 204. Of the address Signals inputted in time sequence, row address signals are stored in a row address buffer (Row Address Buffer) 205, and column address signals are stored in a column address buffer (Column Address Buffer) 206. A refresh counter (Refresh Counter) 208 generates row addresses at automatic refresh (Automatic Refresh) and self refresh (Self Refresh).

In the case of a storage capacity of 256 Mbits, for example, an address terminal for inputting the address signal A14 as a column address signal is provided when a memory access is carried out in 2-bit units. In an ×4-bit configuration, the address signals up to the address signal A11 are rendered valid. In an ×8-bit configuration, the address signals up to the address signal A10 are made valid, and the address signals up to the address signal A9 are rendered valid in an ×16-bit configuration. In the case of a storage capacity of 64 Mbits, the address signals up to the address signal A10 are rendered valid in an ×4-bit configuration, and the address signals up to the address signal A9 are made valid in an ×8-bit configuration. Further, the address signals up to the address signal A8 are set valid in an ×16-bit configuration, as shown in the drawing.

The output of the column address buffer 206 is supplied to a column address counter (Column Address Counter) 207 as preset data therefor. The column address counter 207 outputs column address signals defined as preset data or values obtained by sequentially incrementing the column address signals to the column address decoders 203A through 203D in a burst mode specified by a command or the like to be described later.

A mode register (Mode Register) 213 holds various operation mode information therein. Of the row decoders (Row Decoders) 201A through 201D, only one corresponding to the bank specified by a bank select (Bank Select) circuit 212 is activated to allow the operation of selecting each word line. Although the invention is not restricted in particular, a control circuit (Control Logic) 209 is supplied with external control signals such as clock signals CLK, /CLK (symbol/indicate each of bar signals which means that signals marked therewith are row enable signals), a clock enable signal CKE, a chip select signal /CS, a column address strobe signal /CAS, a row address strobe signal /RAS and a write enable signal /WE, etc., /DM and DQS, and address signals inputted through the mode register 213. The control circuit 209 forms internal timing signals for controlling an operation mode for the DDR SDRAM and the operations of the circuit blocks, based on changes in the levels of these signals, timing, etc. and is provided with input buffers respectively corresponding to the signals.

The clock signals CLK and /CLK are inputted to a DLL circuit 214 through a clock buffer, from which an internal clock is generated. Although the invention is not restricted in particular, the internal clock is used as a signal to be inputted to each of the data output circuit 211 and the DQS buffer 215. The clock signals sent via the clock buffer are supplied to clock terminals used for the supply thereof to the data input circuit 210 and the column address counter 207.

Other external input signals are rendered significant in synchronism with the rising edge of the internal clock signal. The chip select signal /CS provides instructions for the commencement of a command input cycle according to its low level. When the chip select signal /CS is of a high level (kept in a chip non-selected state), other inputs do not make sense. However, the state of selection of each memory bank, and its internal operations, such as a burst operation, etc. to be described later, are not affected by a change to the chip non-selected state. The respective signals /RAS, /CAS and /WE are different in function from corresponding signals employed in the normal DRAM and are set as significant signals upon defining command cycles to be described later.

The clock enable signal CKE is a signal for indicating the effectiveness of the next clock signal. If the signal CKE is of a high level, then the rising edge of the next clock signal CLK is regarded as valid. If the signal CKE is of a low level, it is then rendered invalid. Incidentally, when an external control signal /OE for performing output enable control on the data output circuit 211 in a read mode is provided, such a signal /OE is also supplied to the control circuit 209. When the signal is high in level, for example, the data output circuit 211 is brought to a high-output impedance state.

The row address signals are defined based on the levels of A0 through A11 in a row address strobe/bank active command cycle to be described later synchronized with the rising edge of the clock signal CLK (internal clock signal).

The address signals A12 and A13 are regarded as bank select signals in the row address strobe/bank active command cycle. Namely, one of the four memory banks 0 through 3 is selected according to a combination of A12 and A13. Although the invention is not restricted in particular, the selection control on the memory banks can be carried out according to processes, such as the activation of only a row decoder on the selected memory bank side, the non-selection of all the column switch circuits on the non-selected memory bank side, connections to the data input circuit 210 and the data output circuit 211 on the selected memory bank side alone, etc.

When the ×16-bit configuration is set in 256 Mbits as described above, the column address signals are defined according to the levels of A0 through A9 in a read or write command (corresponding to a column address/read command or a column address/write command to be described later) cycle synchronized with the rising edge of the clock signal CLK (internal clock). Each of the column addresses defined in this way is set as a start address for a burst access.

Main operation modes of the SDRAM, which are instructed by commands, will next be explained.

(1) Mode register set command (Mo):

This is a command for setting the mode register 30. The corresponding command is specified by /CS, /RAS, /CAS and /WE=low level. Data (register set data) to be set is supplied through each of A0 through A11. Although the invention is not restricted in particular, the register set data includes a burst length, a CAS latency, a write mode, etc. Although the invention is not restricted in particular, a settable burst length takes 2, 4 and 8 and a settable CAS latency assumes 2 and 2.5. A settable write mode is defined as burst write and single write.

The CAS latency indicates what cycles of internal-clock signal are wasted from the falling edge of the /CAS to the output operation of the output buffer 211 upon a read operation specified by a column address/read command to be described later. An internal operation time used for the reading of data is required until the read data is established or determined. The CAS latency is used to set the internal operation time according to the frequency of the internal clock signal. In other words, when an internal clock signal of a high frequency is used, the CAS latency is set to a relatively large value. On the other hand, when an internal clock signal of a low frequency is used, the CAS latency is set to a relatively small value.

(2) Row address strobe/bank active command (Ac):

This is a command for providing instructions for a row address strobe and for making the selection of memory banks based on A12 and A13 effective. This command is specified according to /CS and /RAS=low level and /CAS and /WE=high level. At this time, addresses supplied to A0 through A9 are taken in or captured as row address signals, whereas signals supplied to A12 and A13 are captured as signals for selecting the memory banks. Their capture operations are executed in synchronism with the rising edge of the internal clock signal, as described above. When the corresponding command is specified, for example, a word line in a memory bank specified by the command is selected. Thus, memory cells connected to the corresponding word line are conductive to their corresponding complementary bit lines.

(3) Column address/read command (Re):

This is a command required to start a burst read operation. Further, this is also a command for providing instructions for a column address strobe. The present command is specified according to /CS and /CAS=low level and /RAS and /WE=high level. Column addresses supplied to A0 through A9 (in the case of the ×16-bit configuration) at this time are captured as column address signals, respectively. Thus, the captured column address signals are supplied to the column address counter 207 as burst start addresses.

Before the burst read operation specified thereby, a memory bank and a word line lying therein have been selected in the row address strobe/bank active command cycle. Upon the burst read operation in this state, memory cells connected to the selected word line are successively selected in accordance with each address signal outputted from the column address counter 207 in synchronism with the internal clock signal and items of data are sequentially read therefrom. The number of the sequentially-read data is set as a number specified by the above burst length. The output buffer 211 starts reading data while waiting for the number of cycles in the internal clock signal defined by the CAS latency.

(4) Column address/write command (Wr):

The corresponding command is specified according to /CS, /CAS and /WE=low level and /RAS=high level. Addresses supplied to A0 through A9 at this time are captured as column address signals. Thus, the captured column address signals are supplied to the column address counter 207 as burst start addresses upon the burst write. The procedure of the burst write operation specified thereby is also performed in a manner similar to the burst read operation. However, no CAS latency is provided for the write operation and the capturing of the write data is started from after one clock of the column address/write command cycle.

(5) Precharge command (Pr):

This is defined as a command for starting a precharge operation on each memory bank selected by A12 and A13. This command is specified by /CS, /RAS and /WE low level and /CAS=high level.

(6) Autorefresh command:

This is a command required to start autorefresh and is specified by /CS, /PAS and /CAS=low level and /WE and CKE=high level.

(7) No-operation command (Nop):

This is a command for indicating the non-execution of a substantial operation and is specified by /CS=low level and /RAS, /CAS and /WE=high level.

When another memory bank is specified in the course of the burst operation and the row address strobe/bank active command is supplied while the burst operation is being performed by one memory bank in the DDR SDRAM, no influence is exerted on the operation of one memory bank being under the corresponding execution, and the operation of a row address system in another memory bank is allowed.

Thus, unless data D0 through D15 collide with one another at a data input/output terminal comprising 16 bits, for example, the precharge command and the row address strobe/bank active command for a memory bank different from a memory bank to be processed or handled by an process-unfinished command are issued during the execution of the corresponding command to thereby allow the commencement of an internal operation in advance. Since the DDR SDRAM according to the present embodiment performs the memory access in 16-bit units, has the addresses corresponding to about 4M, based on the addresses of A0 through A11, and comprises the four memory banks as described above, it has a storage capacity of about 256 Mbits (4M×4 banks×16 bits) as a whole.

A detailed read operation of the DDR SDRAM is as follows. The respective signals of the chip select /CS, /RAS and /CAS and write enable /WE are inputted in synchronism with the CLK signal. A row address and a bank select signal are inputted simultaneously with /RAS=0 and held in the row address buffer 205 and the bank select circuit 212, respectively. The row decoder 210 for the bank designated by the bank select circuit 212 decodes a row address signal, and hence, the corresponding memory cell array 200 outputs row overall data as a small signal. The outputted small signal is amplified by and held in the corresponding sense amplifier 202. Thus, the specified bank is rendered active (Active).

After three CLKs following the input of the row address, a column address and a bank select signal are inputted simultaneously with CAS=0 and respectively held in the column address buffer 206 and the bank select circuit 212. If the specified bank is active, then the held column address is outputted from the column address counter 207 and the corresponding column decoder 203 selects a column. The selected data is outputted from the sense amplifier 202. The data outputted at this time corresponds to two pairs or sets (8 bits in an x4-bit configuration and 32 bits in an x16-bit configuration).

The data outputted from the sense amplifier 202 is outputted from the data output circuit 211 to the outside of the chip through a data bus DataBus. Timing provided to output it is synchronized with both the rising and falling edges of QCLK outputted from the DLL 214. At this time, the two pairs of data are parallel-to-serial converted into data of one pair×two as described above. Simultaneously with the output of the data, the DQS buffer 215 outputs a data strobe signal DQS therefrom. When the burst length stored in the mode register 213 is 4 or more, the column address counter 207 automatically increments addresses to read out the next column data.

The DLL 214 plays a role in producing an operating clock for the data output circuit 211 and the DQS buffer 215. In the data output circuit 211 and the DQS buffer 215, time is required between the input of the internal clock signal generated by the DLL 214 thereto and the actual output of the data signal and the data strobe signal therefrom. Therefore, a suitable replica circuit is used to advance the phase of the internal clock signal ahead of the external CLK, thereby allowing the phases of the data signal and the data strobe signal to coincide with that of the external clock CLK. Thus, the DQS buffer is brought to an output high impedance state except for the above data output operation.

Since the DQS buffer 215 of the DDR SDRAM is kept in the output high impedance state upon a write operation, a data strobe signal DQS is inputted to the terminal DQS from a data processor such as a microprocessor or the like, and write data synchronized therewith is inputted to the terminal DQS. The data input circuit 210 serially captures the write data inputted from the terminal DQS as described above according to a clock signal formed based on the data strobe signal inputted from the terminal DQS, converts the data into parallel form in synchronism with the clock signal CLK, followed by transfer to a memory bank selected through the data bus DataBus. Further, the data is written into a selected memory cell of such a memory bank.

Owing to the application of the present invention to the above-described DDR SDRAM, a semiconductor memory capable of high-speed writing and reading can be configured, while the memory chip is reduced in size.

Operations and effects obtained from the above-described embodiments are as follows:

(1) An effect is obtained in that memory array areas each including a plurality of bit lines provided along a first direction, a plurality of word lines provided along a second direction orthogonal to the first direction, and a plurality of memory cells provided in association with portions where the plurality of bit lines and the plurality of word lines intersect respectively, are provided in plural form in the first direction and disposed alternately relative to sense amplifier areas, first common input/output lines connected through bit lines and first selection circuits associated with such sense amplifier areas are provided, and a signal transfer path or channel extending in the second direction and for transferring a read signal and a write signal between the memory cells is provided as each of second common input/output lines connected through the plurality of first common input/
output lines and second selection circuits corresponding to a
plurality of memory arrays disposed along the first direction,
whereby high integration and the stabilization and speeding
up of operation can be realized.

(2) In addition to the above, another effect is obtained in
that a dynamic memory cell, which comprises a MOSFET
and a capacitor and wherein the gate of the MOSFET is
defined as a selection terminal, one source or drain thereof
is defined as an input/output terminal and the other source or
drain thereof is connected to a storage node used as one
electrode of the capacitor, is used to thereby allow the
implementation of high integration.

(3) In addition to the above, a further effect is obtained in
that the first common input/output lines comprise first wirings which extend over the sense amplifier areas in the
second direction and are respectively connected to the bit
lines in the corresponding memory array areas through the
first selection circuits, and second wirings which extend
over the memory array areas in the second direction and
extend outwardly of memory cell array areas comprised of
the plurality of memory array areas so as to be connected to
one end of the second selection circuits, respectively, at least
one second common input/output line is configured so as to
include third signal lines which extend along the first
direction outside the memory cell array areas as viewed in
the second direction, and the second selection circuits are
respectively provided at portions where second signal lines
and the third signal lines are respectively connected, so as to
avoid the layout thereof in each cross area, whereby respective merits such as a reduction in the number of wirings on
each sub-word driver, a reduction in the number of circuits
within each cross area, and a constraint reduction in the area
of each sub-amplifier circuit are produced.

(4) In addition to the above, a still further effect is
obtained in that each of the second selection circuits comprises an amplifier circuit for amplifying a signal transferred
between the first common input/output lines and the second
common input/output lines according to a select signal,
whereby a timing margin is unnecessary and speeding-up is
made possible.

(5) In addition to the above, a still further effect is
obtained in that at least two memory cell array areas are
provided as viewed in the second direction of a semiconductor chip, and the third signal lines included in the second
common input/output lines are dispersedly disposed on both
sides of each memory cell array area as viewed in the second
direction thereof, whereby the transfer of a signal between
the first common input/output line and the second selection
circuit can be speeded up.

(6) In addition to the above, a still further effect is
obtained in that each of sub-word drivers for respectively
selecting the word lines is provided between the memory
array areas provided along the second direction, and the
second select signal generating circuit for forming a signal
for selecting one of the word lines, which corresponds to
each memory cell array area, is provided inside the semiconductor chip, whereby the word lines are also brought into
a hierarchical structure, and hence the speeding-up of the
operation of selecting the word lines and a wiring area for
guiding the second signal lines and the third signal lines into
their corresponding main amplifiers can easily be ensured.

(7) In addition to the above, a still further effect is
obtained in that the second common input/output lines
further comprise fourth signal lines each of which is connected to each third signal line extended in the first direction
and is disposed so as to extend over the memory array area
in the second direction and each of which connects a main
amplifier for amplifying a signal read out from each memory
cell provided adjacent to the second select signal generating
circuit, and a write amplifier for transferring a write signal
to the memory cell, whereby the influence of noise from a
column select signal in a burst mode is avoided and signal
transfer paths or channels between the above lines and
input/output lines used commonly to a plurality of memory
cell arrays can reasonably be laid out.

(8) In addition to the above, a still further effect is
obtained in that the fourth signal lines are collectively
disposed on a specific memory array area placed along the
second direction, and the main and write amplifiers are
collectively laid out in accordance with the layout of the
fourth signal lines, whereby signal transfer channels
between the above lines and input/output lines used commonly to a plurality of memory cell arrays can be shortened.

(9) In addition to the above, a still further effect is
obtained in that the memory cell array areas comprising a
plurality of memory array areas respectively disposed in the
first and second directions are provided at least two in the
second direction of the semiconductor chip, each of subword driver areas for respectively selecting the word lines is
provided between the memory array areas provided along
the second direction, and the second select signal generating
circuit for forming a signal for selecting the word line is
provided inside the semiconductor chip, and the second
common input/output lines comprise fifth signal lines which
extend along the sub-word driver areas and each of which is
connected via the second selection circuit to a portion
intersecting each first common input/output line, and sixth
signal lines connected to the fifth signal lines and each of
which extends over each memory array area in the second
direction and connects the main amplifier and write amplifier provided adjacent to the second select signal generating
circuit, whereby the influence of noise from a column select
signal in a burst mode is avoided and signal transfer channels between the above lines and input/output lines used
commonly for a plurality of memory cell arrays can reasonably be laid out.

(10) In addition to the above, a still further effect is
obtained in that the memory cell array areas are provided
two by two in the first and second directions of the semiconductor chip, each of sub-word driver areas for respectively selecting the word lines is provided between the
memory array areas provided along the second direction in
each of said memory cell array areas, the second select
signal generating circuits corresponding to the memory cell
array areas provided along the second direction are provided
inside the semiconductor chip, the first select signal generating circuits corresponding to the memory cell array areas
provided along the first direction are respectively provided
inside the semiconductor chip, the main amplifiers and write
amplifiers provided in association with the four memory cell
array areas are connected to an input/output circuit through
further provided third common input/output lines, and the
specific memory array area is placed in a specific position of
each memory cell array area as viewed in the first direction
so that the third common input/output lines become shortest,
whereby each signal transfer channel which leads to the
input/output circuit can be shortened.

(11) In addition to the above, a still further effect is
obtained in that each memory cell array area is divided into
a first memory block and a second memory block separated
into two in the first direction, the first select signal generating circuit commonly supplies a select signal to the first memory block and the second memory block, the second select signal generating circuit supplies a select signal to each of the first memory block and the second memory block, and the specific memory array area is set as one located in the direction of the center of the chip, of the memory array areas provided for the first and second memory blocks as viewed in the first direction, whereby each signal transfer channel, which leads to the input/output circuit, can be shortened.

(12) In addition to the above, a still further effect is obtained in that each of the first common input/output lines and second common input/output lines is configured as a pair for transferring complementary signals, the amplifier circuit comprises a sub amplifier comprising differential type first and second MOSFETs having gates to which the first common input/output lines are connected, and having drains cross-connected to the second common input/output lines, third and fourth MOSFETs which are respectively provided at the sources of the first and second MOSFETs and each of which forms an operating current according to a select signal, and a fifth MOSFET which is provided between the sources of the differential MOSFETs and turned off upon at least a write operation, and a CMOS buffer comprising a pair of P channel type MOSFET and N channel type MOSFET for driving the first common input/output lines in response to complementary signals from the second common input/output lines, whereby a timing margin becomes unnecessary and high-speed signal transmission can be realized.

(13) In addition to the above, a still further effect is obtained in that two parallel-connected MOSFETs identical in size are used for the fifth MOSFET, whereby the layout of elements is free of waste and a desired amplification characteristic can be obtained.

(14) A still further effect is obtained in that memory array areas each including a plurality of bit lines provided along a first direction, a plurality of word lines provided along a second direction orthogonal to the first direction, and a plurality of memory cells provided in association with portions where the plurality of bit lines and the plurality of word lines intersect, respectively, are provided in plural form in the first direction and disposed alternately relative to sense amplifier areas, first common input/output lines connected to their corresponding bit lines and first selection circuits corresponding to such sense amplifier areas are provided, each of amplifier circuits for respectively transferring signals between the plurality of first common input/output lines and second common input/output lines associated with a plurality of memory arrays disposed along the first direction according to a select signal is used to form a second selection circuit, and such an amplifier circuit comprises a sub amplifier for reading comprising differential type first and second MOSFETs having gates to which the first common input/output lines are connected, and having drains cross-connected to the second common input/output lines, third and fourth MOSFETs which are respectively provided at the sources of the first and second MOSFETs and each of which forms an operating current according to a select signal, and a fifth MOSFET which is provided between the sources of the differential MOSFETs and turned off upon at least a write operation, and a CMOS buffer for writing comprising a pair of P channel type MOSFET and N channel type MOSFET for driving the first common input/output lines in response to complementary signals from the second common input/output lines, whereby the function of selecting a signal line and a timing margin become unnecessary, and high-speed signal transmission is allowed.

While the invention made by the present inventors has been described specifically with reference to illustrated embodiments, the present invention is not limited to the disclosed embodiments. It is needless to say that various changes can be made thereto within a scope not departing from the substance thereof. For instance, a memory cell may be one involatilized by using a ferroelectric capacitor as memory means in addition to the above-described dynamic memory cell. The ferroelectric capacitor may be one used for both a non-volatile and a volatile mode similar to the dynamic memory cell according to the magnitude of a voltage applied to its dielectric film.

Various embodiments can be adopted for the configuration of a memory cell array or a memory bank, or a memory array or a memory mat. Word lines may be lines which adopt a word-shunt system in addition to the above-described hierarchical word-line system. Namely, only IO may be one brought into a hierarchical structure. An input/output interface of a dynamic RAM can take or adopt various embodiments such as a LAN-bus configuration or one capable of being applied to a synchronous DRAM or the like, or one placed on the logic circuit, etc.

Advantageous effects obtained by typical aspects of the invention disclosed in the present application will be described in brief as follows: Memory array areas each including a plurality of bit lines provided along a first direction, a plurality of word lines provided along a second direction orthogonal to the first direction, and a plurality of memory cells provided in association with portions where the plurality of bit lines and the plurality of word lines intersect, respectively, are provided in plural form in the first direction and disposed alternately relative to sense amplifier areas. First common input/output lines connected through bit lines and first selection circuits associated with such sense amplifier areas are provided. Second common input/output lines connected through the plurality of first common input/output lines and second selection circuits corresponding to a plurality of memory arrays disposed along the first direction are provided. Each of the second common input/output lines is extended in the second direction to form a signal transfer channel for transmitting a signal read from each memory cell and a signal written therein. Consequently, high integration and the stabilization and speeding-up of operation can be realized.

Memory array areas each including a plurality of bit lines provided along a first direction, a plurality of word lines provided along a second direction orthogonal to the first direction, and a plurality of memory cells provided in association with portions where the plurality of bit lines and the plurality of word lines intersect, respectively, are provided in plural form in the first direction and disposed alternately relative to sense amplifier areas. First common input/output lines connected through bit lines and first selection circuits associated with such sense amplifier areas are provided. An amplifier circuit for transferring a signal between each of the plurality of first common input/output lines and at least one second common input/output line, both associated with a plurality of memory arrays disposed along the first direction according to a select signal, is used to configure each of second selection circuits. Such an amplifier circuit comprises a sub amplifier for reading, comprising differential type first and second MOSFETs having gates to which the first common input/output lines are connected, and having drains cross-connected to the second common input/output lines, third and fourth MOSFETs which are respectively provided at the sources of the first and second MOSFETs and each of which forms an operating current according to a select signal, and a fifth MOSFET which is provided between the sources of the differential MOSFETs and is turned off upon at least a write operation, and a CMOS buffer for writing, comprised of a pair of P channel type MOSFET and N channel type MOSFET for driving the first common input/output lines in response to complementary signals from the second common input/output lines, whereby the function of selecting a signal line and a timing margin become unnecessary, and high-speed signal transmission is allowed.

What is claimed is:

1. A semiconductor memory device comprising:

a memory bank area including a plurality of memory array areas arranged in a first direction, a plurality of sense amplifier areas arranged alternately relative to the plurality of memory array areas, and a plurality of first local input/output lines provided corresponding to the plurality of first sense amplifier areas and extending in a second direction intersecting the first direction;

a plurality of first sub-amplifiers arranged along the memory bank area in the first direction, each of the plurality of first sub-amplifiers being connected to a corresponding one of the plurality of the first local input/output lines; and a first main input/output line including a first line extending in the first direction and a second line extending in the second direction and directly connected to the first line, wherein each of the plurality of memory array areas has a plurality of dynamic memory cells provided at intersections between a plurality of word lines and a plurality of data lines, wherein the first line is connected to the plurality of first sub-amplifiers, and wherein the second line passes through at least one of the plurality of memory array areas.

2. A semiconductor memory device according to claim 1, further comprising:

a main amplifier coupled with the second line, wherein the memory bank area is arranged between the main amplifier and the plurality of first sub-amplifiers.

3. A semiconductor memory device according to claim 1, wherein each of the plurality of first sub-amplifiers has a first switch circuit, and wherein the first switch circuit selects to transfer an output of the first sub-amplifier to the first line.

4. A semiconductor memory device according to claim 1, wherein each of the first local input/output lines comprises a pair of lines for transferring complementary signals, wherein each of the plurality of first sub-amplifiers has differential type first and second MOSFETs, and wherein a gate of the first MOSFET is connected to one of the first local input/output line pair and a gate of the second MOSFET is connected to the other of the first local input/output line pair.

5. A semiconductor device according to claim 1, wherein the plurality of memory array areas are arranged in the first direction and the second direction so as to form a matrix, and wherein the memory bank area further includes a plurality of the word driver areas arranged alternately relative to the plurality of memory array areas in the second direction.

6. A semiconductor device according to claim 5, further comprising:

a plurality of second sub-amplifiers arranged along the memory bank area in the first direction, wherein the memory bank area further includes a plurality of second local input/output lines provided corresponding to a plurality of second sense amplifier areas which are arranged at a different row from the plurality of first sense amplifier areas and extending in the second direction, wherein each of the plurality of second sub-amplifiers is connected to a corresponding one of the plurality of the second local input/output lines, and wherein the memory bank area is arranged between the plurality of first sub-amplifiers and the plurality of second sub-amplifiers.

* * * * *